(12) United States Patent
Gross et al.

(10) Patent No.: US 8,095,860 B2
(45) Date of Patent: Jan. 10, 2012

(54) METHOD FOR IMPLEMENTING STOCHASTIC EQUALITY NODES

(75) Inventors: Warren J. Gross, Montreal (CA); Shie Mannor, Montreal (CA); Saeed Sharifi Tehrani, Montreal (CA)

(73) Assignee: The Royal Institution for the Advancement of Learning/McGill University, Montreal, Quebec (CA)

( * ) Notice: Subject to any disclaimer, the term of this patent is extended or adjusted under 35 U.S.C. 154(b) by 868 days.

(21) Appl. No.: 12/153,749

(22) Filed: May 23, 2008

(65) Prior Publication Data

US 2008/0294970 A1    Nov. 27, 2008

Related U.S. Application Data

(60) Provisional application No. 60/924,632, filed on May 23, 2007, provisional application No. 60/935,848, filed on Sep. 4, 2007.

(51) Int. Cl.
*H03M 13/00* (2006.01)
(52) U.S. Cl. ........ 714/801; 714/752; 714/780; 714/781; 714/784; 714/794
(58) Field of Classification Search .................. 714/801, 714/752, 780, 781, 784, 794
See application file for complete search history.

(56) References Cited

U.S. PATENT DOCUMENTS

| | | | |
|---|---|---|---|
| 6,633,856 B2 | 10/2003 | Richardson | |
| 7,020,829 B2 | 3/2006 | Eroz et al. | |
| 7,174,495 B2 | 2/2007 | Boutillon | |
| 7,281,192 B2 | 10/2007 | Shen | |
| 7,395,490 B2 | 7/2008 | Richardson | |
| 7,907,784 B2 * | 3/2011 | Gladkova et al. | 382/232 |
| 2006/0156181 A1 | 7/2006 | Ha | |
| 2007/0011568 A1 | 1/2007 | Hocevar | |

FOREIGN PATENT DOCUMENTS

| EP | 1 536 568 A1 | 6/2005 |
|---|---|---|
| WO | WO 2008/034254 A1 | 3/2008 |

OTHER PUBLICATIONS

Tehrani et al., Stochastic Decoding of LDPC Codes, Oct. 2006, IEEE, vol. 10, No. 10, pp. 716-718.*

(Continued)

*Primary Examiner* — John J Tabone, Jr.
(74) *Attorney, Agent, or Firm* — Freedman & Associates

(57) ABSTRACT

The present invention relates to a decoding method and system for stochastic decoding of linear block codes with parity check matrix. Each encoded sample of a set of encoded samples is converted into a corresponding probability. For each probability a corresponding probability message is the generated by encoding each probability as a sequence of digital symbols. Each probability message is then provided to a respective node of a logic circuitry for stochastic decoding. The logic circuitry represents a factor graph of the parity check matrix of the linear block code. Using the logic circuitry each probability message is processed for determining an estimated sequence of information symbols. If an equality node is in a hold state a chosen symbol is provided from a corresponding memory which is updated by storing output symbols from the equality node when the same is in a state other than a hold state.

20 Claims, 30 Drawing Sheets

OTHER PUBLICATIONS

Tehrani et al., An Area-Efficient FPGA-Based Architecture for Fully-Parallel Stochastic LDPC Decoding, 2007, IEEE, pp. 255-260.*

R.G. Gallager: "Low Density Parity Check Codes", Cambridge, MA: MIT Press, 1963.

R.G. Gallager, "Low Density Parity Check Codes", IRE Trans. On Information Theory, Jan. 1962, pp. 21-28.

D.J.C. MacKay and R.M. Neal: "Near Shannon Limit Performance of Low Density Parity Check Codes", Electron. Lett., vol. 32, No. 18, pp. 1645-1646.

F. Kschischang, B. Frey, and H. Loeliger: "Factor Graphs and the Sum Product Algorithm", IEEE Trans. Inform. Theory, vol. 47, No. 2, pp. 498-519, Feb. 2001.

J. Jiang and K.R. Narayanan: "Iterative Soft-Input Soft-Output Decoding of Reed-Solomon Codes", IEEE Trans. Inform. Theory, vol. 52, No. 8, pp. 3746-3756, Aug. 2006.

W. Gross, V. Gaudet, and A. Milner: "Stochastic Implementation of LDPC Decoders", in the 39th Asilomar Conf. on Signals, Systems, and Computers, Pacific Grove, CA, Nov. 2005.

C. Winstead, V. Gaudet, A. Rapley, and C. Schlegel: "Stochastic Iterative Decoders", Proc. of the IEEE Int. Symp. on Information Theory, Sep. 2005, pp. 1116-1120.

C. Winstead: "Error Control Decoders and Probabilistic Computation", Tohoku Univ. 3rd SOIM-COE Conf., Sendai, Japan, Oct. 2005.

Canadian Intellectual Property Office: "International Search Report of PCT/CA2008/000971" mailed Aug. 12, 2008.

* cited by examiner

Fig. 21

METHOD FOR IMPLEMENTING STOCHASTIC EQUALITY NODES

This application claims the benefit of U.S. Provisional Patent Application No. 60/924,632 filed May 23, 2007, and U.S. Provisional Patent Application No. 60/935,848 filed Sep. 4, 2007, the entire contents of which are incorporated herein by reference.

FIELD OF THE INVENTION

The instant invention relates to decoding of linear codes with parity check matrix and in particular to a decoding method and system for stochastic decoding of linear block codes.

BACKGROUND

Data communication systems comprise three components: a transmitter; a transmission channel; and a receiver. Transmitted data become altered due to noise corruption and channel distortion. To reduce the presence of errors caused by noise corruption and channel distortion, redundancy is intentionally introduced, and the receiver uses a decoder to make corrections. In modern data communication systems, the use of error correction codes plays a fundamental role in achieving transmission accuracy, as well as in increasing spectrum efficiency. Using error correction codes, the transmitter encodes the data by adding parity check information and sends the encoded data through the transmission channel to the receiver. The receiver uses the decoder to decode the received data and to make corrections using the added parity check information.

Low Density Parity Check (LDPC) codes were first disclosed by Gallanger in the early 1960's, R. G. Gallager: "*Low Density Parity Check Codes*", Cambridge, Mass.: MIT Press, 1963. LDPC codes are linear codes which have been found to be capable of error correcting performance close to the Shannon limit, as disclosed in D. J. C. MacKay and R. M. Neal: "*Near Shannon limit performance of low density parity check codes*", Electron. Lett., vol. 32, no. 18, pp. 1645-1646. Shortly after the development of Turbo codes researchers noticed that existing graphical representations such as Bayesian networks and factor graphs are unifying frameworks for LDPC decoding using a Sum Product (SP) process involving message passing over the edges of a factor graph, as disclosed in F. Kschischang, B. Frey, and H. Loeliger: "*Factor graphs and the sum product algorithm*", IEEE Trans. Inform. Theory, vol. 47, no. 2, pp. 498-519, February 2001. Unfortunately, hardware implementations of LDPC decoders based on this process are highly complex and costly.

Reed-Solomon (RS) codes are non-binary linear block codes whose symbols are chosen from a Galois Field (GF). Good minimum distance of RS codes together with their non-binary nature result in good bit and burst error-correcting performance. RS codes are employed in a wide spectrum of applications including magnetic recording, media transmission and satellite communication. Methods for RS decoding are generally classified into Hard Decision Decoding (HDD) and Soft Decision Decoding (SDD) methods. In many existing applications algebraic HDD is used for RS decoding. However, algebraic HDD methods are not able to use "soft" information provided by maximum a posteriori or turbo decoders. Iterative decoding based on the SP process has been used in LDPC decoding. When iterative decoding is applied to a code with high-density parity check matrix, as is the case for RS codes, it is likely that the iterative decoding becomes locked at local minimum points—pseudo-equilibrium points—that do not correspond to a valid codeword. Based on this observation, a method disclosed in J. Jiang and K. R. Narayanan: "*Iterative soft-input soft-output decoding of Reed-Solomon codes*", IEEE Trans. Inform. Theory, vol. 52, no. 8, pp. 3746-3756, August 2006, adapts the parity check matrix during each SP process iteration step according to reliabilities such that the columns of the adapted parity check matrix corresponding to the unreliable bits are sparse. The SP process is then applied to the adapted parity check matrix. It was shown that this adaptation technique prevents the SP process from becoming locked at pseudo-equilibrium points and improves the convergence of the decoding process. Unfortunately, existing hardware implementations of RS decoders based on this process are highly complex and costly.

Stochastic computation has been introduced in the 1960's as a method to design low precision digital circuits. Stochastic computation has been used, for example, in neural networks. The main feature of stochastic computation is that probabilities are represented as streams of digital bits which are manipulated using simple circuitry. Its simplicity has made it attractive for the implementation of error correcting decoders in which complexity and routing congestion are major problems, as disclosed, for example, in W. Gross, V. Gaudet, and A. Milner: "*Stochastic implementation of LDPC decoders*", in the 39th Asilomar Conf. on Signals, Systems, and Computers, Pacific Grove, Calif., November 2005.

A major difficulty observed in stochastic decoding is the sensitivity to the level of switching activity—bit transition—for proper decoding operation, i.e. switching events become too rare and a group of nodes become locked into one state. To overcome this "latching" problem, C. Winstead, V. Gaudet, A. Rapley, and C. Schlegel: "*Stochastic iterative decoders*", in Proc. of the IEEE Int. Symp. on Information Theory, September 2005, pp. 1116-1120, teach "packetized supernodes" which prevent correlation between messages. A supernode is a special node which tabulates the incoming stochastic messages in histograms, estimates their probabilities and regenerates uncorrelated stochastic messages using random number generators. Unfortunately, the introduction of supernodes diminishes the advantages of the stochastic computation by necessitating complex hardware for implementing the supernodes. In addition to supernodes, C. Winstead: "*Error control decoders and probabilistic computation*", in Tohoku Univ. 3rd SOIM-COE Conf., Sendai, Japan, October 2005, teaches scaling of channel LLRs to a maximum value to ensure the same level of switching activity for each block.

Unfortunately, these methods provide only limited performance when decoding state-of-the-art LDPC and RS codes on factor graphs.

It would be desirable to provide a method for iterative stochastic decoding of state-of-the-art LDPC and RS codes on factor graphs, which overcomes at least some of the above-mentioned limitations.

SUMMARY OF EMBODIMENTS OF THE INVENTION

In accordance with an aspect of the present invention there is provided a logic circuitry comprising logic components forming equality nodes and parity check nodes, the equality nodes and the parity check nodes for performing an equality function and a parity check function in a stochastic decoding process, respectively, the equality nodes and the parity check nodes being electrically coupled such that they represent a factor graph of a parity check matrix of a linear code, the logic circuitry comprising a plurality of counter circuitries, each counter circuitry comprising a counter electrically coupled to a respective equality node, each counter circuitry for providing a chosen symbol in dependence upon the respective equality node being in a hold state.

In accordance with an aspect of the present invention there is provided a method performed using a counter circuitry for each of a plurality of equality nodes of a logic circuitry for stochastic decoding, the counter circuitry comprising a counter, the method performed in each counter circuitry comprising:

receiving an output symbol from the respective equality node when the same is in a regular state;

one of incrementing and decrementing content of the counter in dependence upon the received output symbol; and, providing an output symbol in dependence upon the content when the respective equality node is in a hold state.

In accordance with an aspect of the present invention there is provided a logic circuitry comprising logic components forming equality nodes and parity check nodes, the equality nodes and the parity check nodes for performing an equality function and a parity check function in a stochastic decoding process, respectively, the equality nodes and the parity check nodes being electrically coupled such that they represent a factor graph of a parity check matrix of a linear code, wherein each equality node of at least a subset of the equality nodes comprises:

a plurality of sub nodes forming the equality node; and, internal memory interposed between the sub nodes such that the internal memory is connected to an output port of a respective sub node and to an input port of a following sub node, the internal memory for providing a chosen symbol if a respective sub node is in a hold state.

BRIEF DESCRIPTION OF THE FIGURES

Exemplary embodiments of the invention will now be described in conjunction with the following drawings, in which:

FIG. 8 is a simplified flow diagram of a method for stochastic decoding according to an embodiment of the invention for execution on the stochastic decoder shown in FIG. 7a;

FIG. 21 is a schematic diagram illustrating an adapted parity-check matrix used in RS decoding; and, FIG. 22 is a simplified flow diagram of a method for stochastic RS decoding according to an embodiment of the invention.

DETAILED DESCRIPTION OF EMBODIMENTS OF THE INVENTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

While the stochastic decoding method and decoder is described for decoding LDPC and RS codes for simplicity, it will become evident to those skilled in the art that the stochastic decoding method and decoder are not limited thereto but are also applicable for decoding of other linear block codes such as, for example, Bose-Chaudhuri-Hocquenghem (BCH) codes, and Turbo-Product codes, as well as for decoding of Convolutional LDPC codes.

In the description hereinbelow mathematical terms such as, for example, optimum, maximum, etc. are used for clarity, but as is evident to one skilled in the art these terms are not to be considered as being strictly absolute, but to also include degrees of approximation depending, for example, on the application or technology.

For the sake of clarity and to provide a better understanding of the invention, a brief overview of LDPC codes, factor graphs, SP decoding, and stochastic computation on factor graphs will be presented in the following.

LDPC codes are a class of binary linear block codes in which a set of code words, $x \in C$, spans the null space of a sparse parity check matrix H. A (n, k) binary LDPC code is then implemented using a (n−k)×n parity check matrix H in which $Hx=0$. Equation (1) is an example of a parity check matrix for a (12,3) LDPC code:

$$H = \begin{bmatrix} 0 & 0 & 1 & 0 & 0 & 1 & 1 & 1 & 0 & 0 & 0 & 0 \\ 1 & 1 & 0 & 0 & 1 & 0 & 0 & 0 & 0 & 0 & 0 & 1 \\ 0 & 0 & 0 & 1 & 0 & 0 & 0 & 0 & 1 & 1 & 1 & 0 \\ 0 & 0 & 0 & 0 & 1 & 1 & 1 & 0 & 0 & 1 & 0 & 0 \\ 1 & 0 & 1 & 0 & 0 & 0 & 0 & 1 & 0 & 0 & 1 & 0 \\ 0 & 1 & 0 & 1 & 0 & 0 & 0 & 0 & 1 & 0 & 0 & 1 \\ 1 & 1 & 0 & 1 & 0 & 0 & 1 & 0 & 0 & 0 & 0 & 0 \\ 0 & 0 & 0 & 0 & 0 & 1 & 0 & 1 & 0 & 0 & 1 & 1 \\ 0 & 0 & 1 & 0 & 1 & 0 & 0 & 0 & 1 & 1 & 0 & 0 \end{bmatrix}. \quad (1)$$

Figure 1:
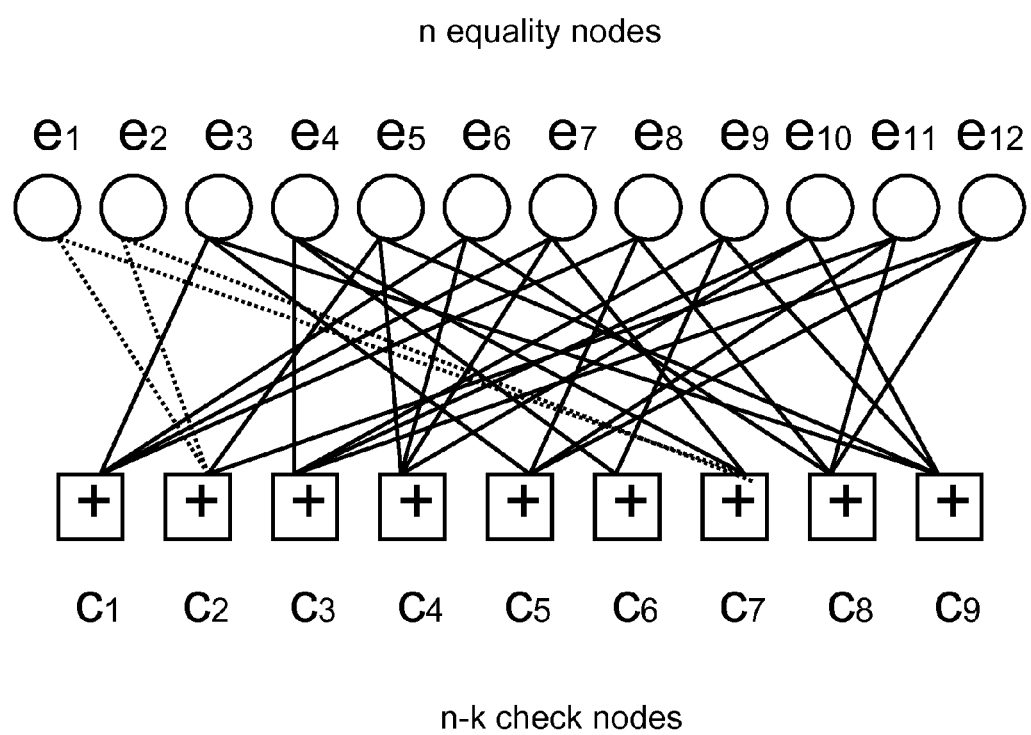
FIG. 1 is a diagram illustrating a factor graph of a parity check matrix.

LDPC codes are effectively represented using a bipartite graph called a factor graph. Factor graphs provide a complete representation of the code, as well as help to describe the decoding process. FIG. 1 illustrates the factor graph of the parity check matrix H in equation (1). Nodes of a factor graph are separated into two distinct sets—equality nodes and check nodes. Each edge in the graph connects a node from the two sets. This factor graph comprises n=12 equality nodes and n−k=9 check nodes. Check node $c_i$ is connected to equality node $e_j$ if and only if element $h_{ij}$ of the parity check matrix H is one. The number of edges connected to a node is called degree of the node. In regular LDPC codes the equality node degree, $d_e$, and the check node degree, $d_c$, are the same for all equality nodes and parity check nodes, respectively. In irregular LDPC codes $d_e$ and $d_c$ vary for different nodes.

The SP process, also known as message passing process, is an iterative process used for LDPC decoding. The SP process uses message passing over the edges of factor graphs. It has been shown that SP processes are capable of closely approximating the optimal decoding process for Additive White Gaussian Noise (AWGN) channels, i.e. the Maximum A posteriori Probability (MAP) process. The decoding performance is dependent on the length of cycles in the factor graph, i.e. the longer the cycles the better the decoding performance. Short cycles such as the 4-cycle—indicated by dashed lines in FIG. 1—correlate the messages and degrade the decoding performance.

In the SP process a Log-Likelihood Ratio (LLR) of a received binary sequence is determined and a decision is made by comparing the LLR to a threshold value. In a Binary Phase Shift Keying (BPSK) transmission (±1) over an AWGN channel, the channel LLR value of the i-th sample in a received block (i=1, . . . , n) is defined as:

$$L_i = \log\left(\frac{Pr(x_i = +1 \mid y_i)}{Pr(x_i = -1 \mid y_1)}\right) = \frac{2y_i}{\sigma^2}, \quad (2)$$

where $\sigma^2$ is the variance of the AWGN and, $x_i \in \{-1,+1\}$ and $y_i \in R$ denote the i-th sample of the transmitted and received block, respectively. For example, let $P_{i \rightarrow j} \in [0,i]$ be a probability message from equality node $e_i$ to check node $c_j$ (j=1, . . . , m), and $Q_{j \rightarrow i} \in [0,1]$ be a probability message from check node $c_j$ to equality node $e_i$. Also, let $\{e_i, e_l, e_m\}$ be a set of equality nodes connected to a $d_c=3$ check node $c_j$, and $\{c_j, c_r, c_s\}$ be a set of check nodes connected to a $d_e=3$ equality node $e_i$. It is noted, that this is without loss of generality, since it is possible to convert higher degree nodes to sub graphs containing only degree three nodes. Message passing steps in the SP process are then described as follows.

I) For equality node $e_i$, convert $L_i$ to an initialization probability as $P_{int}^i = e^{L_i}/(e^{L_i}+1)$.

II) The equality node $e_i$ sends $P_{i \rightarrow j} = P_{int}^i$ to check node $c_j$.

Figure 2A:
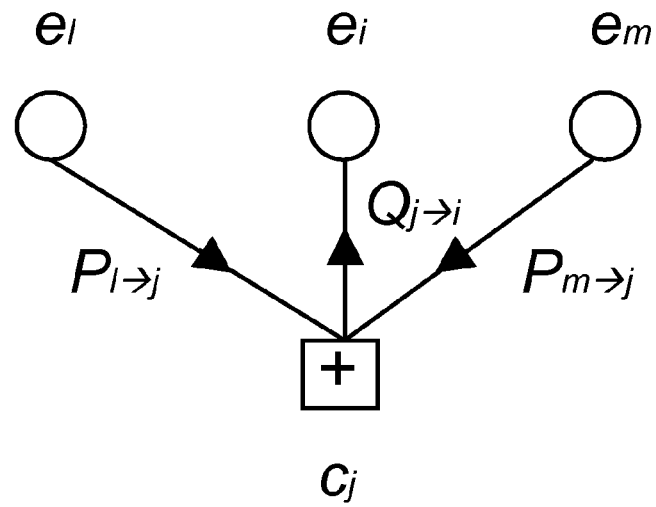
FIGS. 2a and 2b are diagrams illustrating processing of probability message in a SP process.

III) The check node $c_j$ determines $Q_{j \rightarrow i}$ and sends it to the equality node $e_i$, as shown in FIG. 2a, with $Q_{j \rightarrow i}$ being determined as:

$$Q_{j \rightarrow i} = P_{l \rightarrow j}(1 - P_{m \rightarrow j}) + P_{m \rightarrow j}(1 - P_{l \rightarrow j}). \quad (3)$$

Figure 2B:
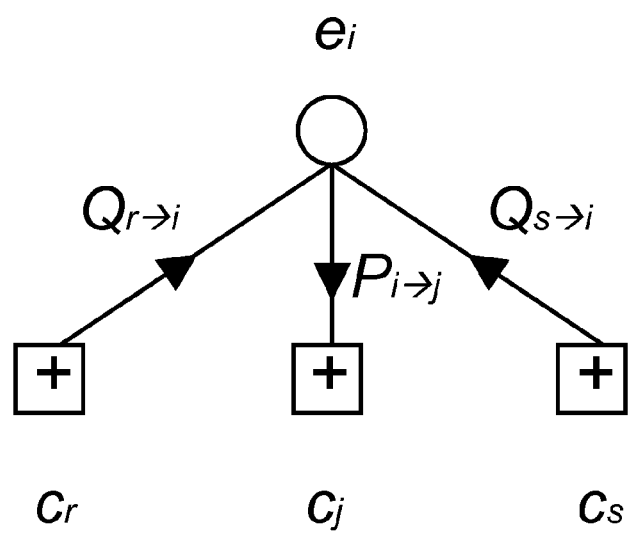

IV) The equality node $e_i$ determines $P_{i \rightarrow j}$ and sends it to the check node $c_j$, as shown in FIG. 2b, with $P_{i \rightarrow j}$ being determined as:

$$P_{i \rightarrow j} = \frac{Q_{r \rightarrow i} Q_{s \rightarrow i}}{Q_{r \rightarrow i} Q_{s \rightarrow i} + (1 - Q_{r \rightarrow i})(1 - Q_{s \rightarrow i})}. \quad (3)$$

V) Return to step III.

VI) Stop the iteration once the estimated code word, $\hat{x}$, satisfies the criterion $H\hat{x}=0$, or after a predetermined number of iterations has been completed.

The hardware implementation of the above SP process performs at each node of the factor graph complex computational operations on probabilities necessitating provision of a large number of hardware components. Furthermore, in the SP process probability messages are passed between the nodes resulting in routing congestion problems. As is evident, these problems are substantially increased for long LDPC codes. For example, the hardware implementation of a fully parallel LDPC decoder with n=1000, $d_e=3$ and 4-bit fixed point representation of the probabilities uses 24000 physical wires—for two directions—to accommodate all edges of the factor graph.

In stochastic computation, the probabilities are encoded using a Bernoulli sequence as a random sequence of $\{a_i\}$ digital bits. It is noted, that in stochastic computation used in decoding processes it is possible to encode the probabilities using deterministic or pseudo-random sequences. Each bit in the sequence is equal to logic '1' with the probability to be encoded. A sequence of N bits with m bits equal to '1' represents the probability of m/N. For example, a sequence of 10 bits with 6 bits equal to logic '1' represents the probability of 0.6. The encoding scheme is not unique, i.e. different encoded stochastic sequences represent a same probability such as:

$$0.6 \rightarrow \begin{cases} 0110011101 \\ 1101010101 \\ 0110100111 \end{cases}$$

The stochastic representation of probabilities enables manipulation of the same using hardware of low complexity. Stochastic multiplication and stochastic division are the two operations used for implementing the decoding process.

Figure 3:
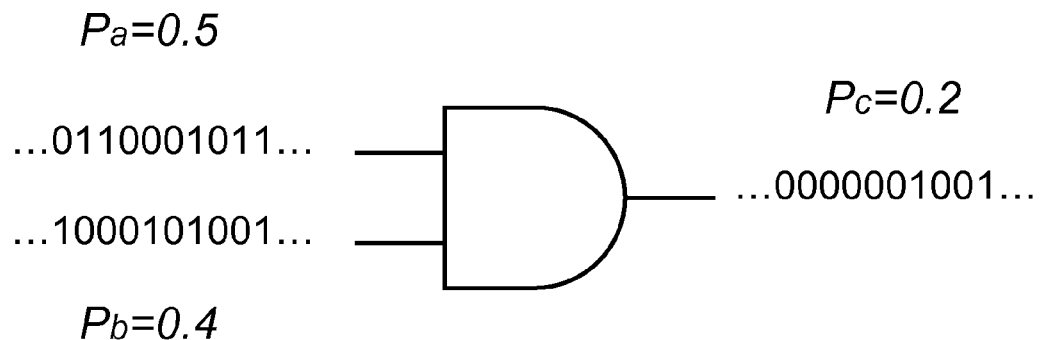
FIG. 3 is a diagram illustrating multiplication in stochastic computation.

For example, let $P_a = Pr(a_i=1)$ and $P_b = Pr(b_i=1)$ be the probabilities to be multiplied. The outcome, $P_c = P_a P_b$, is then determined using an AND gate, as shown in FIG. 3. Similarly, other gates—NOT, XOR, etc.—are used to implement different probability operations.

Figure 4:
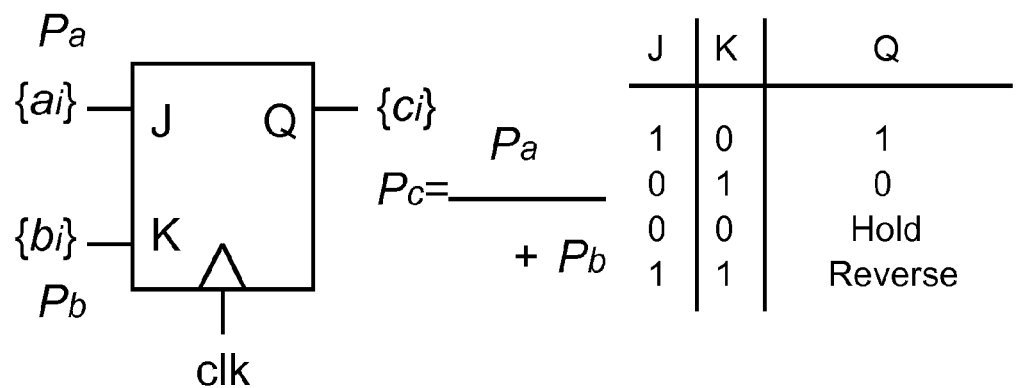
FIG. 4 is a diagram illustrating division in stochastic computation.

FIG. 4 illustrates a JK flip-flop with input sequences of $\{a_i\}$ and $\{b_i\}$ representing the probabilities of $P_c$ and $P_b$, respectively. The output bit $c_i$ is equal to logic '1' with the probability of $P_c$ and is equal to logic '0' with the probability of $1-P_c$. Random output transition from logic '1' to '0' occurs with the probability of $1-P_c)P_a$ and the reverse transition occurs with the probability of $P_cP_b$. From the equality of the expected occurrence of random transition in both directions follows:

$$P_c P_b = (1 - P_c)P_a \rightarrow P_c = \frac{P_a}{P_a + P_b}. \quad (5)$$

The operation of equation (5) is an approximation to $P_a/P_b$, if $P_a \ll P_b^2$.

The stochastic representation of probability messages in the code factor graph enables hardware implementation of bit-serial parity check nodes and equality nodes having low complexity. Let $P_a=\Pr(a_i=1)$ and $P_b=\Pr(b_i=1)$ be the probability of two input bits, $a_i$ and $b_i$, in a $d_c=3$ parity check node. The output probability $P_c$ is then determined as $$P_c = P_a(1-P_b) + P_b(1-P_a) \quad (6)$$

The equality function in a $d_e=3$ equality node for inputs $P_a$ and $P_b$ is determined as $$P_c = \frac{P_a P_b}{P_a P_b + (1 - P_a)(1 - P_b)}. \quad (7)$$

Figure 5A:
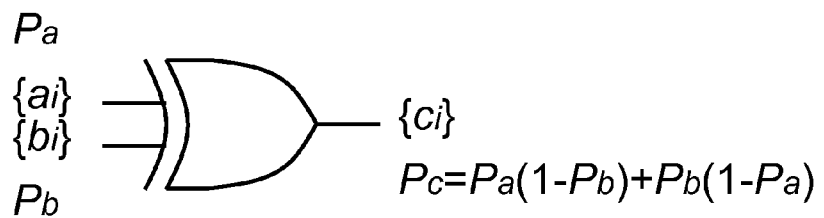
FIG. 5a is a simplified block diagram illustrating a parity check node in stochastic decoding.
Figure 5B:
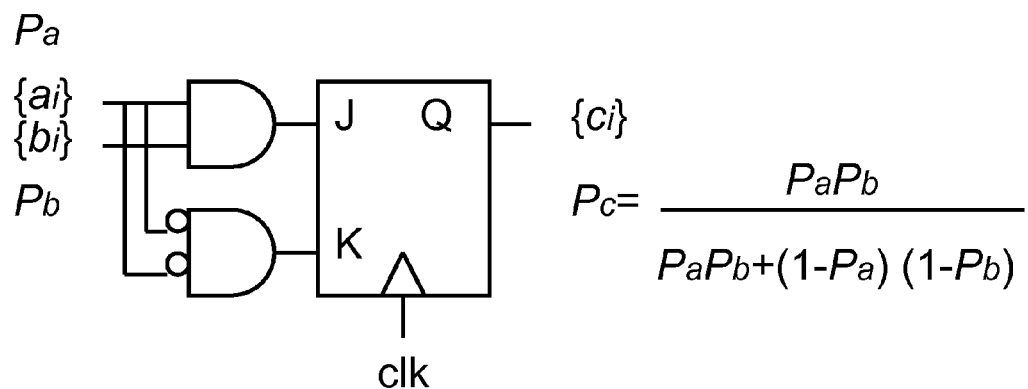
FIG. 5b is a simplified block diagram illustrating an equality node in stochastic decoding.

FIGS. 5a and 5b illustrate the corresponding hardware structures of the parity check node—equation (6)—and the equality node—equation (7), respectively. As is evident to those skilled in the art, higher degree parity check nodes and equality nodes are easily converted to sub-graphs containing only degree three parity check nodes and equality nodes, respectively. It is noted that the equality node shown in FIG. 5b "holds" on the previous output bit (i.e., $c_i=c_{i-1}$) on the edge, if the two input bits are not equal ($a_i \neq b_i$).

In addition to simple equality node and parity check node structures, the stochastic computation also reduces the routing congestion problem, since only one bit—per direction—is used to represent an edge between a parity check node and an equality node. This implies that in a decoding round, the stochastic decoding proceeds by the equality nodes and the parity check nodes exchanging a bit—per direction—along each edge in the code factor graph. In the following, these decoding rounds will be referred to as Decoding Cycles (DCs) to highlight the fact that they do not directly correspond to the iterations in the SP process.

Figure 6:
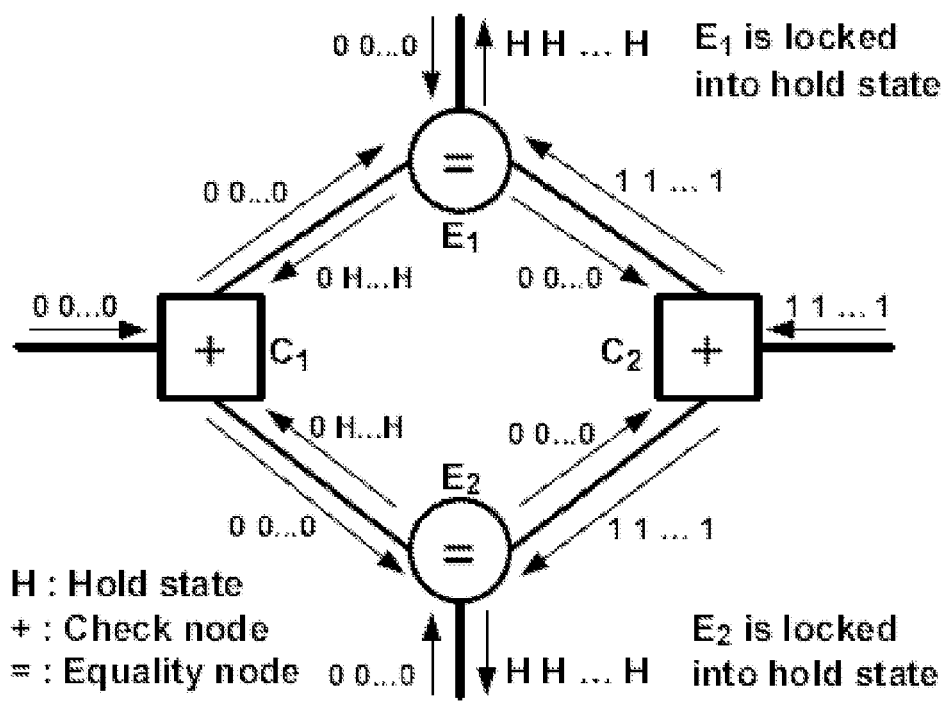
FIG. 6 is a simplified block diagram illustrating an example of latching in a factor graph.

A major difficulty observed in stochastic decoding is the sensitivity to the level of switching activity—bit transition—for proper decoding operation. The "latching" problem is described for stochastic decoding on graphs with cycles in C. Winstead, V. Gaudet, A. Rapley, and C. Schlegel: "*Stochastic iterative decoders*", in Proc. of the IEEE Int. Symp. on Information Theory, September 2005, pp. 1116-1120. This problem refers to the situation where a cycle in the graph correlates messages in such a way that causes a group of nodes to lock into a state which is solely maintained by the correlated messages. The latching problem is particularly acute in LDPC decoders as taught in C. Winstead: "*Error control decoders and probabilistic computation*", in Tohoku Univ. 3$^{rd}$ SOIM-COE Conf., Sendai, Japan, October 2005. Further, the latching problem is increased at high Signal-to-Noise-Ratios (SNRs) where the received LLRs become so large that the corresponding probabilities approach 0 (or 1). In this situation, the stochastic sequences contain mostly bits of logic '0' (or '1'), thus switching events become too rare for proper decoding operation. FIG. 6 illustrates how the lack of switching activity within a 4-cycle forces the equality nodes into a "hold" state for several DCs.

In an attempt to overcome the latching problem, C. Winstead, V. Gaudet, A. Rapley, and C. Schlegel: "*Stochastic iterative decoders*", in Proc. of the IEEE Int. Symp. on Information Theory, September 2005, pp. 1116-1120, teach "packetized supernodes" which prevent correlation between messages. A supernode is a special equality node which tabulates the incoming stochastic messages in histograms, estimates their probabilities and regenerates uncorrelated stochastic messages using random number generators. The supernodes were used for trellis decoding of a (256,121) product Turbo code with the supernodes replacing all the equality nodes such that they were performing the conventional SP calculation according to equation (4) after a time step to calculate the probabilities of the new outgoing messages and to regenerate new stochastic messages. In addition to supernodes, C. Winstead: "*Error control decoders and probabilistic computation*", in Tohoku Univ. 3$^{rd}$ SOIM-COE Conf., Sendai, Japan, October 2005, teaches scaling of channel LLRs for stochastic decoding of a (16,11) Hamming code. In this method, the channel LLRs for each block are scaled to a maximum value to ensure the same level of switching activity for each block. As is evident, the introduction of supernodes diminishes the advantages of the stochastic computation by necessitating a highly complex hardware structure for implementing the supernodes. Furthermore, it has been found that this technique is not applicable for the decoding of numerous LDPC and Hamming codes.

In the following description of the various embodiments according to the invention same reference numerals will be used for same components. It is noted, that the various embodiments of the stochastic decoder and their modes of operation, as well as combinations thereof, are not limited to decoding of LDPC codes but are applicable for decoding numerous other classes of linear codes with parity check matrix such as, for example, Repeat-Accumulate codes, Turbo codes, BCH codes and Hamming codes, as well as for adaptive and non-adaptive decoding based on belief propagation methods. For simplicity, the various embodiments of the stochastic decoder and their modes of operation are described using a bitwise representation, but it will be apparent to those skilled in the art that they are also implementable using a symbol-wise representation, for example, symbols comprising two bits. Alternatively, symbols comprise a number of outcomes that is other than bit represented—for example decimal numbers. It is further noted, that the various embodiments of the stochastic decoder and their modes of operation, as well as combinations thereof, are not limited to decoding but are also implementable for detection.

Figure 7A:
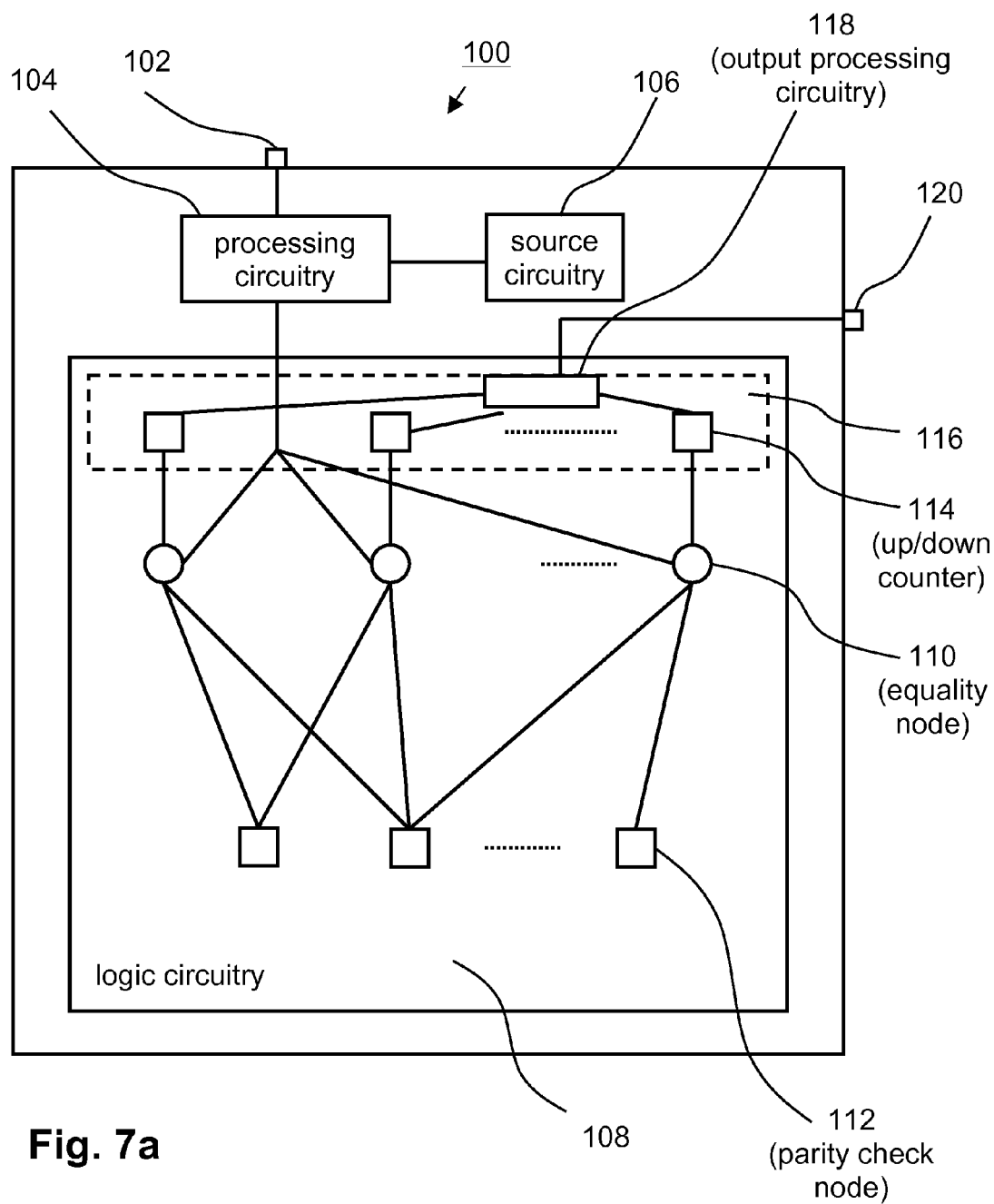
FIG. 7a is a simplified block diagram of a stochastic decoder according to an embodiment of the invention.
Figure 8:
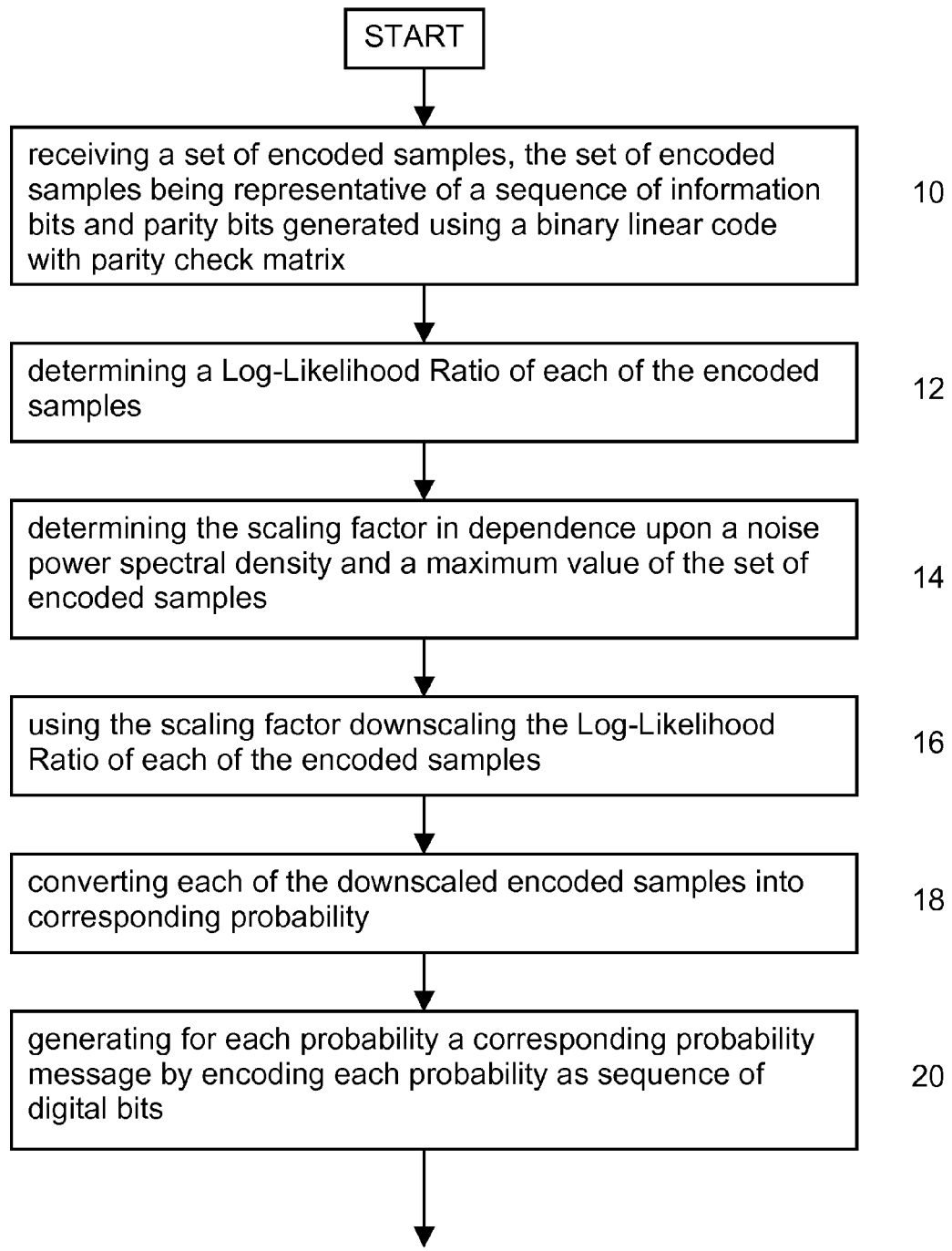
Figure 8:
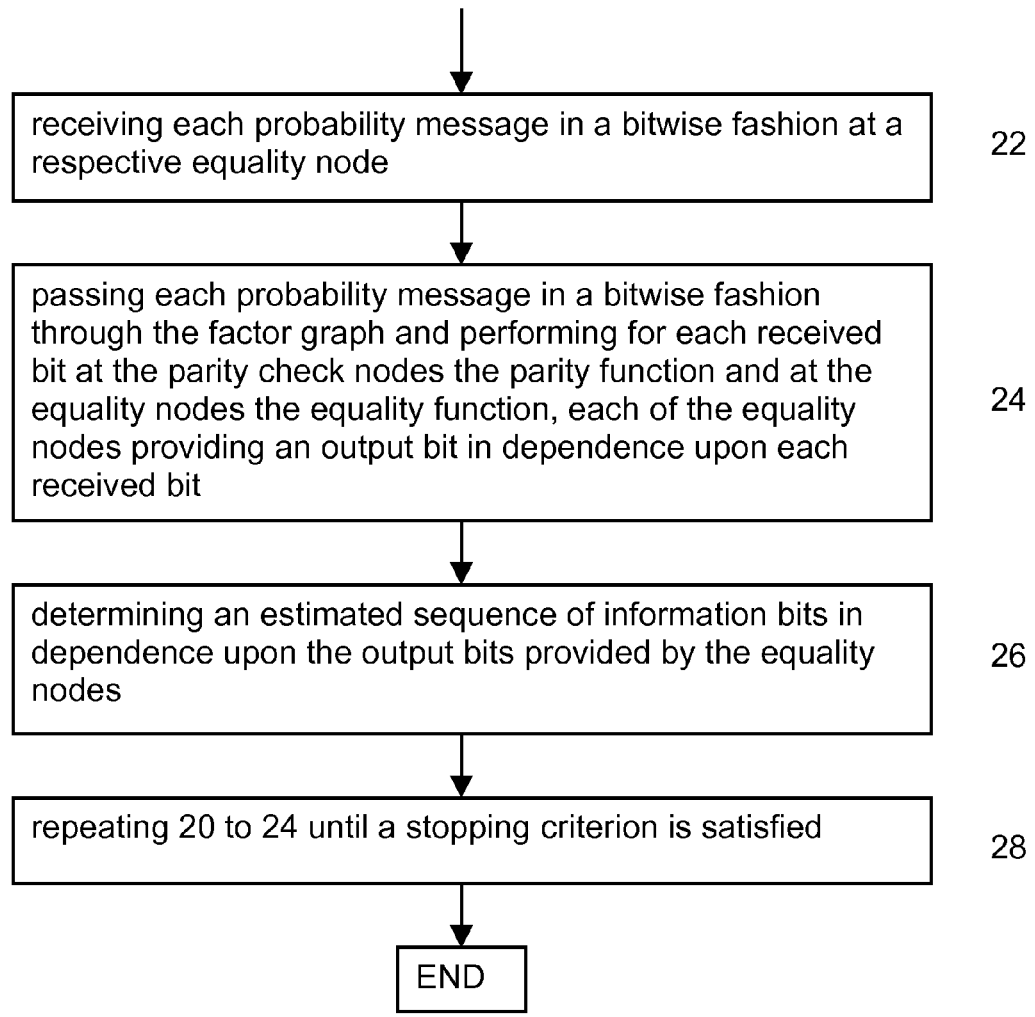

Referring to FIGS. 7a and 8, a simplified block diagram of an embodiment of a stochastic decoder 100 according to the invention, and a simplified flow diagram of an embodiment of a method for stochastic decoding according to the invention for execution on the stochastic decoder 100 are shown, respectively. The stochastic decoder 100 comprises an input port 102, processing circuitry 104 electrically coupled to the input port 102, source circuitry 106 electrically coupled to the processing circuitry 104, logic circuitry 108 electrically coupled to the processing circuitry, output circuitry 116 electrically coupled to the logic circuitry, and output port 120 electrically coupled to the output circuitry 116. In operation, a set of encoded samples is received at the input port 102 for decoding—at 10. The set of encoded samples is representative of a sequence of information bits and parity bits generated using a linear code with parity check matrix such as a LDPC code. Upon receipt, the processing circuitry 104 determines a LLR of each of the encoded samples according to equation (2)—at 12. As is evident, determining of the LLR is employed since it is generally used in decoding but the invention is not limited thereto.

According to an embodiment of the invention, a scaling factor in dependence upon a noise power spectral density and a maximum value of the set of encoded samples is then determined—at 14, and using the scaling factor the LLR of each of the encoded samples is scaled—at 16. For example, the scaled LLR, $L_i'$, for the i-th encoded sample, y, in the received set is calculated as:

$$L_i' = \left(\frac{\alpha N_0}{Y}\right) L_i = \frac{4\alpha y_i}{Y}, \quad (8)$$

where $N_0 = 2\sigma^2$ is the double-sided noise power spectral density, Y is a fixed maximum value of the received encoded samples and, α is a constant factor with 0<α. For example, for BPSK transmission of LDPC codes values of Y=6 and α≅3 provided high performance—Bit Error Rate (BER) performance. As shown above, in Noise-Dependent Scaling (NDS), the received channel LLRs are scaled by a scaling factor proportional to the operating SNR. The scaled LLRs result in probabilities which introduce more switching activity and/or facilitate the convergence in the stochastic decoder. Because the scaling factor is proportional to the noise level, it ensures a substantially similar level of switching activity over different ranges of SNRs. Of course, one of skill in the art will readily arrive at different methods for implementing the NDS. Typically, scaling refers to downscaling though—contrary to common knowledge—there are situations where more switching activity or better convergence is introduced by upscaling.

Using the processing circuitry 104, each of the scaled encoded samples is then—at 18—converted into a corresponding probability, for example according to $P_{init}^i = e^{L_i}/(e^{L_i} + 1)$. At 20, for each probability is then a corresponding probability message generated by encoding each probability as a sequence of digital bits. The sequence is a sequence of N '0' bits and M '1' bits with N and M depending on the probability to be encoded, as shown above for the probability of 0.6. For example, the sequence is generated by the processor 104 in communication with the source circuitry 106, with the source circuitry providing bit sets in one of a deterministic, pseudo-random, and random fashion and the processing circuitry using the bit sets for generating the sequence by concatenating the same and ensuring the correct number of '0'bits and '1' bits in dependence upon the probability to be encoded. It has been found that, for the following stochastic decoding process, sequences of digital bits generated using bit sets produced in a deterministic or pseudo-random fashion are sufficient for ensuring proper decoding operation and high performance of the stochastic decoder 100. For example, the source circuitry 106 comprises a Linear Feedback Shift Register (LFSR) for providing bit sets in a pseudo-random fashion.

The logic circuitry 108 comprises logic components forming equality nodes 110 and parity check nodes 112. For example, each equality node 110 comprises two AND gates electrically coupled to respective J and K inputs of a JK flip-flop, as shown in FIG. 5b, for performing the equality function—equation (7)—and each parity check node 112 comprises an XOR gate, as shown in FIG. 5a, for performing the parity check function—equation (6). The equality nodes 110 and the parity check nodes 112 are electrically coupled such that they represent a factor graph of the parity check matrix, as shown, for example, in FIG. 1. At 22, each probability message is received in a bitwise fashion at a respective equality node 110 and then passed—at 24—in a bitwise fashion through the factor graph while for each received bit the equality function is performed at the equality nodes 110 and the parity check function is performed at the parity check nodes 112. After passage of a bit of each probability message through the factor graph at the end of a DC, each equality node 110 provides an output bit to, for example, a respective up/down counter 114 of the output circuitry 116. The up/down counter 114 is decremented in case of a '0' output bit and increased in case of a '1' output bit. For each DC, the sign bit of each of the up/down counters 114 indicates the "hard" decision, with a '0' sign bit indicating a decoded '+1' and a '1' sign bit indicating a decoded '−1', thus providing—at 26—an estimated sequence of information bits in dependence upon the output bits provided by the equality nodes 110. The above steps 20 to 24 are repeated until a stopping criterion is satisfied—at 28. The stopping criterion is, for example, a predetermined number of DCs unless $H\hat{x}=0$ is satisfied, with H being the parity check matrix and x being the estimated sequence of information bits in dependence upon the output bits provided by the equality nodes 110. The steps 26 and 28 are performed using output processing circuitry 118 or, alternatively, processing circuitry 104. The estimated sequencex satisfying the criterion $H\hat{x}=0$ or being obtained after the predetermined number of DCs is then provided to the output port 120.

Alternatively, instead of checking the parity check matrix for correctness—$H\hat{x}=0$—the output stream provided by the equality nodes 110 is mapped to bits after each DC using, for example, up/down counters. A decrease in switching activity of the up/down counters is indicative of convergence of the decoding process, i.e. convergence to a binary "1" or a binary "0". This enables substantially simpler and faster detection of convergence of the decoding process. Since the power consumption of the up/down counters is proportional to their switching activity convergence is easily detected by simply measuring the power consumption of the up/down counters.

Figure 7B:
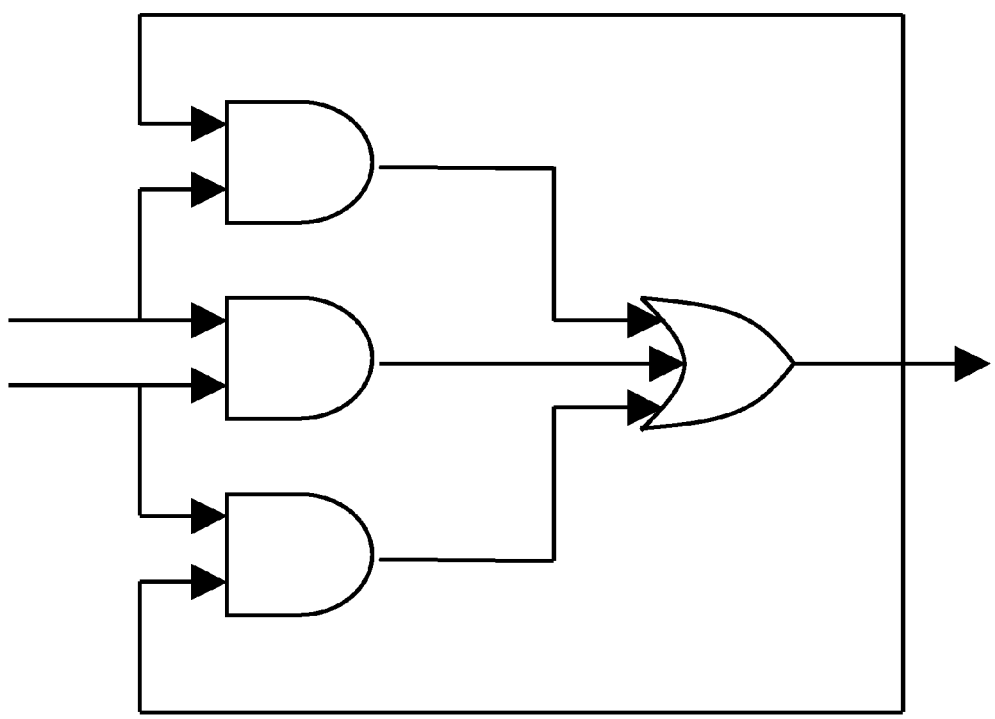
FIG. 7b is a simplified block diagram of a C element.

Optionally, the JK flip-flop is replaced by a C element, shown in FIG. 7b. Using the C element instead of the JK flip-flop enables operation of the equality nodes 110 and the parity check nodes 112 in an asynchronous fashion, i.e. independent from a clock signal. This provides the potential for substantially increasing the processing speed of the stochastic decoding process.

Further optionally, an upscaling factor is determined other than in dependence upon a noise level. For example, the upscaling factor is determined in an empirical fashion using a test signal.

The stochastic equality node 110 has two states of operation:
1) regular state—when input bits of the equality node 110 are equal; and,
2) hold state—when input bits of the equality node 110 are NOT equal.

In the regular state the output bit of the equality node 110 is determined in dependence upon the input bits of the equality node 110. When the equality node 110 is in a hold state, a bit is chosen and provided as output bit of the equality node 110 to de-correlate the stochastic messages, thus reducing the likelihood of the equality nodes 110 getting locked in the hold state. Optionally, memory—such as, for example, registers, shift registers, counters, up/down counters, saturation counters, look-up tables, and combinations thereof—is assigned to the equality node 110 such that one of its previous output bits are chosen as the output bit when in a hold state. The assigned memory is updated only by bits which are produced in the regular state, referred to as "regenerative bits". Regenerative bits stored in the assigned memory are useful for determining statistics of stochastic streams in the decoder/detector and for producing the output bit in a hold state.

Figure 9A:
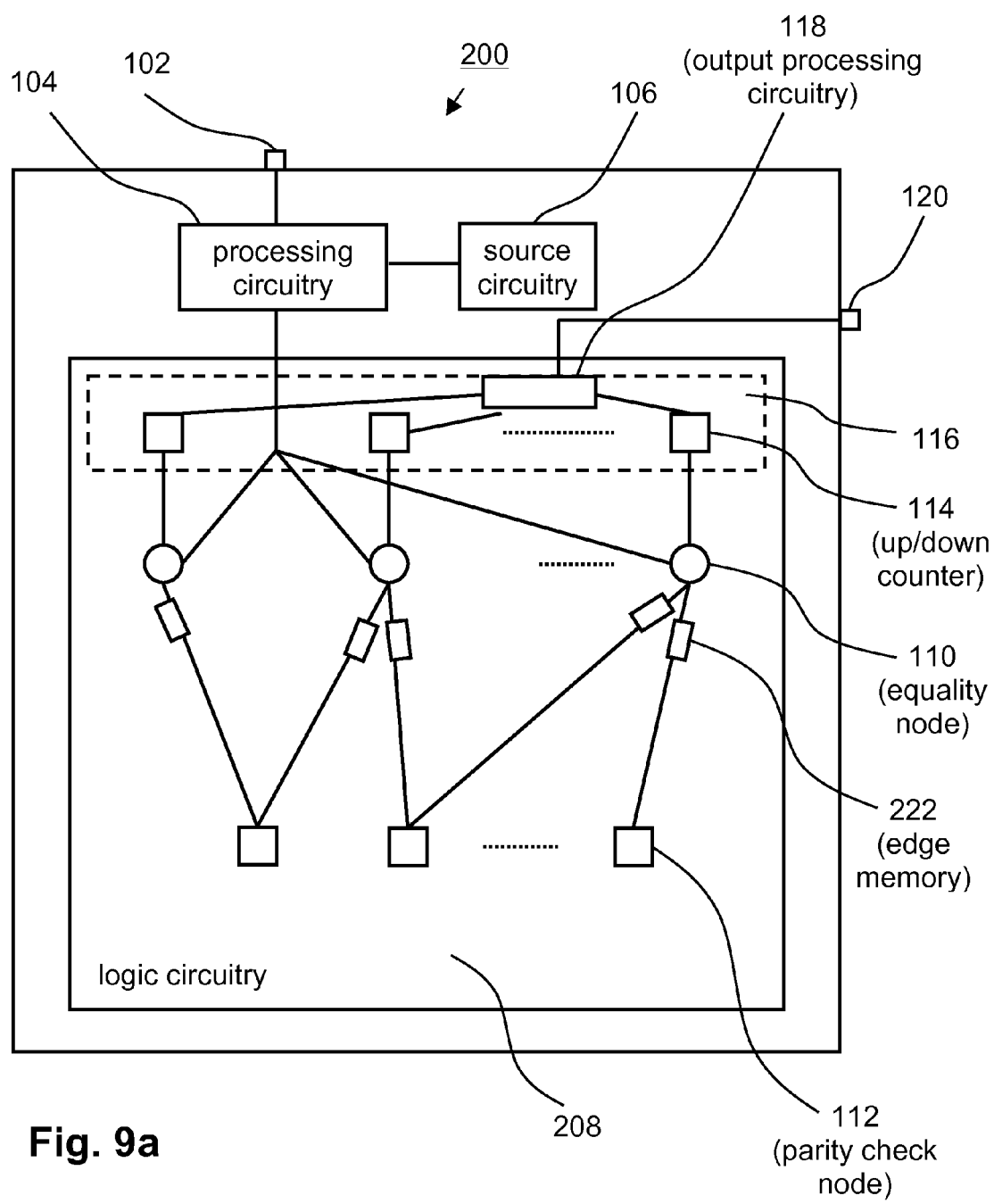
FIGS. 9a to 9c are simplified block diagrams of a stochastic decoder according to an embodiment of the invention.
Figure 9B:
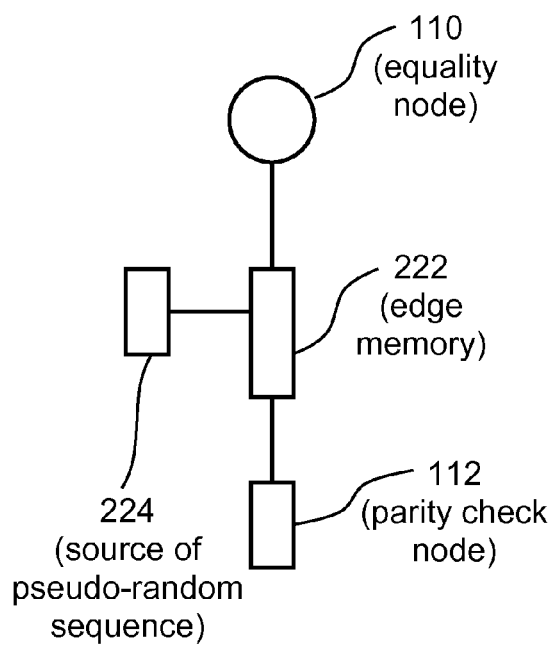
Figure 9C:
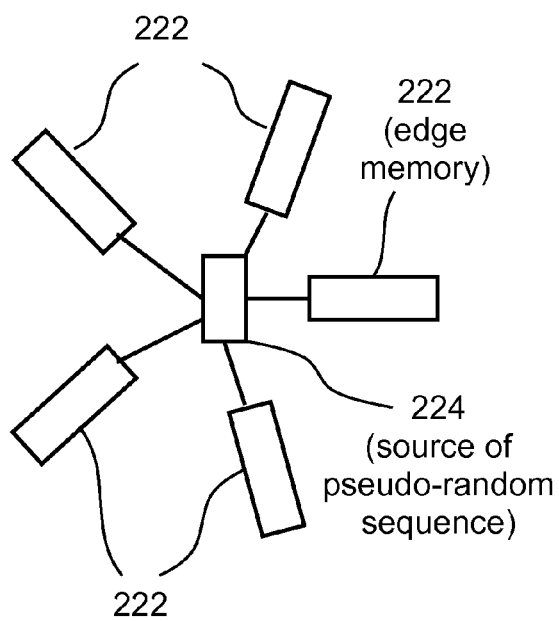
Figure 10:
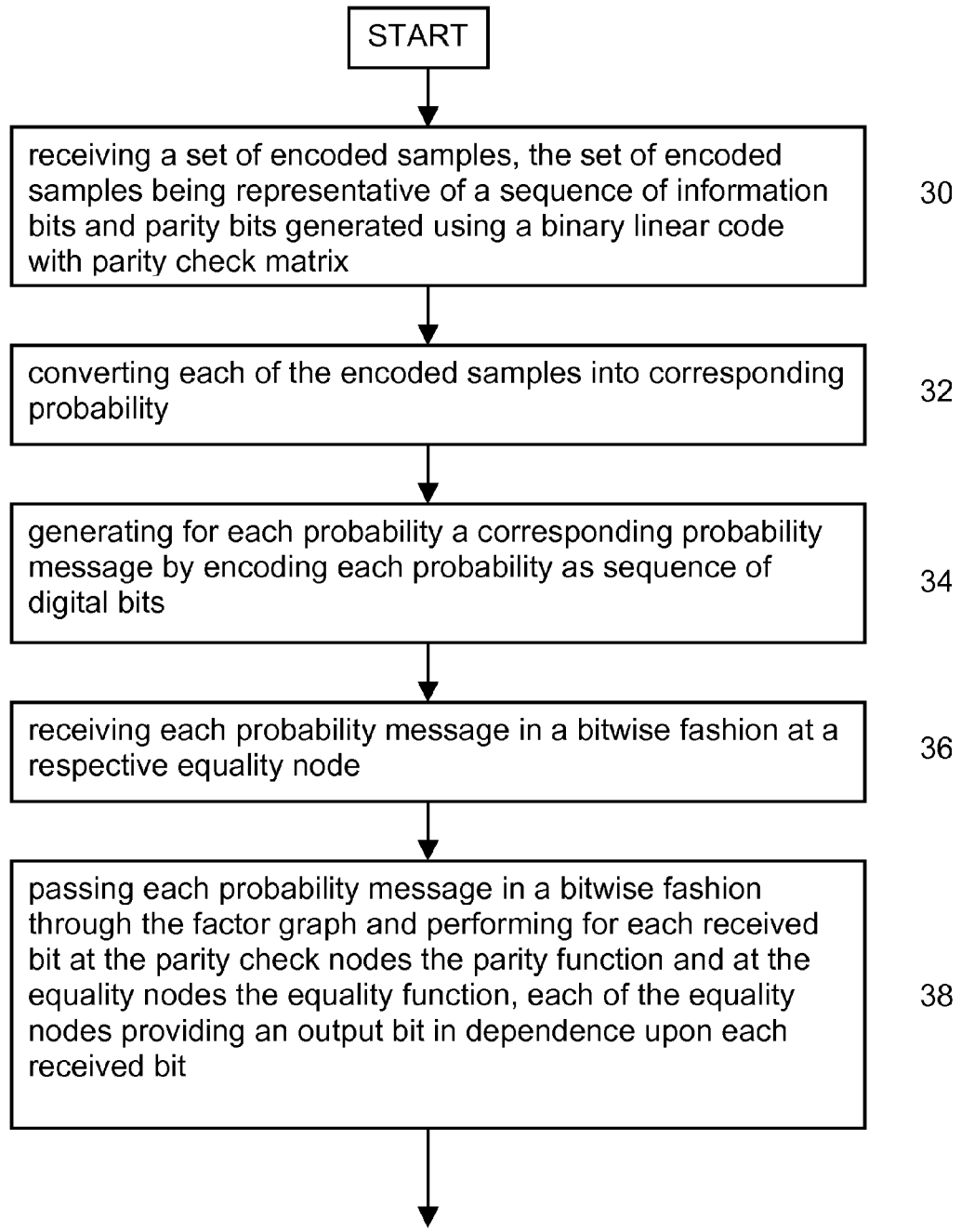
FIG. 10 is a simplified flow diagram of a method for stochastic decoding according to an embodiment of the invention for execution on the stochastic decoder shown in FIGS. 9a to 9c.
Figure 10:
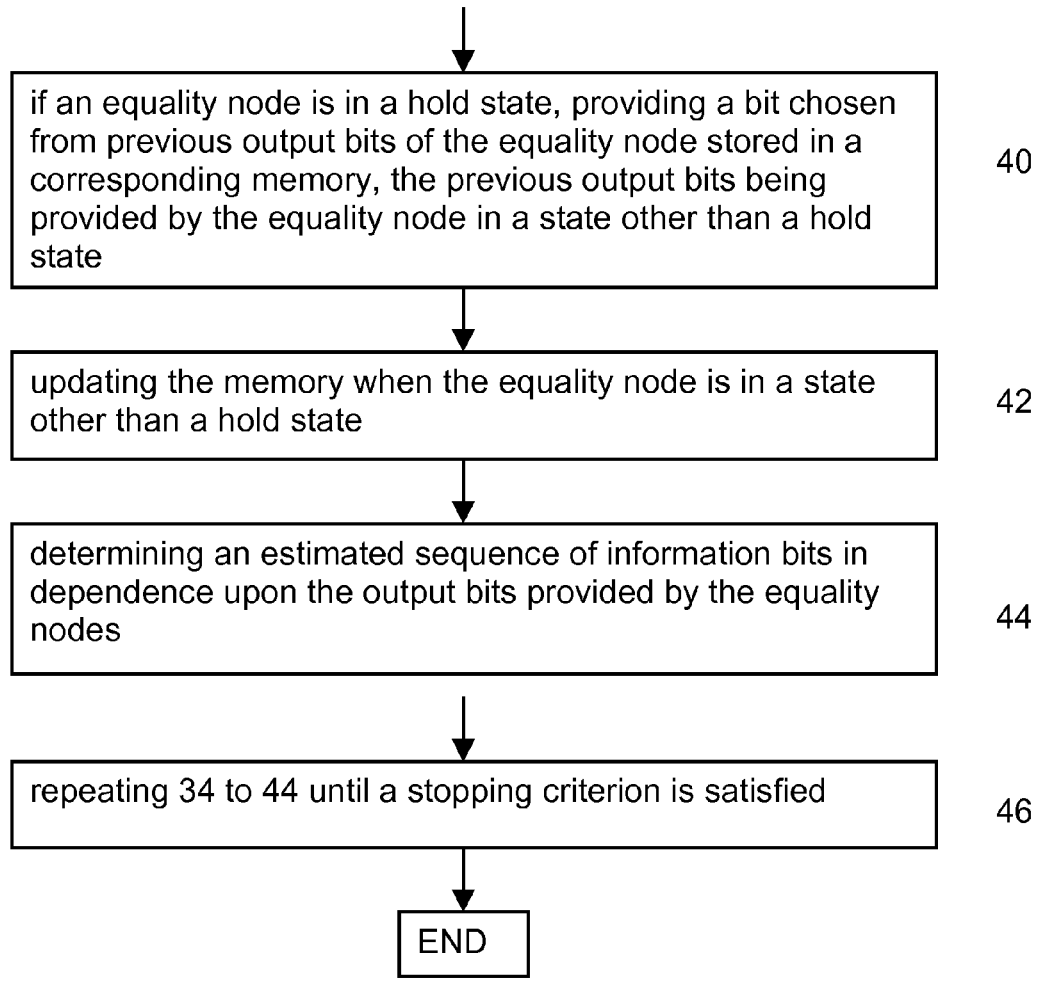

Referring to FIGS. 9*a* and 10, a simplified block diagram of a second embodiment of a stochastic decoder 200 according to the invention, and a simplified flow diagram of a second embodiment of a method for stochastic decoding according to the invention for execution on the stochastic decoder 200 are shown, respectively. The stochastic decoder 200 comprises same main components as the stochastic decoder 100 illustrated in FIG. 7*a*, except for second source circuitry interposed in the logic circuitry 208 at predetermined locations and in communication with the equality nodes 110. The second source circuitry is interposed for providing a chosen bit if a respective equality node 110—or a group of equality nodes 110—is in a hold state, as explained above with respect to FIG. 6. The second source circuitry comprises a plurality of memories 222 referred to as Edge Memories (EMs) with each EM being electrically coupled to a respective equality node 110 at each connection—or edge—of the factor graph. For example, each EM 222 comprises a shift register such as an M-bit shift register with M being an integer number between approximately 8 and 100. Each EM 222 stores output bits of the respective equality node 110 when the respective equality node 110 is in a state other than a hold state and provides one of the stored bits when the respective equality node 110 is in a hold state. There are numerous ways for storing and providing the stored output bits such as: storing and providing the stored output bits in a predetermined order; storing the output bits in a predetermined order and providing the stored output bits out of order in a, for example, pseudo-random fashion; and storing and providing the stored output bits out of order in a, for example, pseudo-random fashion. This updating process reduces the chance of locking an equality node 110 into a fixed state because when a hold state occurs, a bit is chosen from the previous output bits which are not produced in a hold state. For example, each EM 222 is placed at a connection connecting the respective equality node 110 with a corresponding parity check node 112 according to the factor graph, as shown in FIG. 9*b*. Alternatively, each EM 222 is integrated into the respective equality node 110. There are various possibilities for choosing the bit from the EM. For example, the bits are chosen in a deterministic fashion such as in a predetermined order: $1^{st}$ bit, $2^{nd}$ bit, ... $1^{st}$ bit, last bit, $2^{nd}$ bit, $2^{nd}$ last bit; etc. Alternatively, the EM 222 is electrically coupled to a respective source 224 of one of a pseudo-random and random sequence of digital bits, for example, a LFSR for choosing a stored bit in a pseudo-random fashion. Further alternatively, the EMs are grouped in subsets of EMs with each EM 222 of the subset being electrically coupled to a same source 224 of a pseudo-random sequence of digital bits associated therewith, as shown in FIG. 9*c*. As discussed above, higher degree parity check nodes and equality nodes are easily converted to sub-graphs containing only degree three parity check nodes and equality nodes, respectively.

It is noted, that the EMs—such as, for example, shift-register based EMs and counter-based EMs—are optionally used for re-randomizing/de-correlating of the stochastic streams. Here, operation of the EMs is as follows:
1) in every DC the EMs are updated with any bit received from the edge; and,
2) In every DC the output bit of an EM is chosen or generated pseudo-randomly or randomly from its content.

Figure 9D:
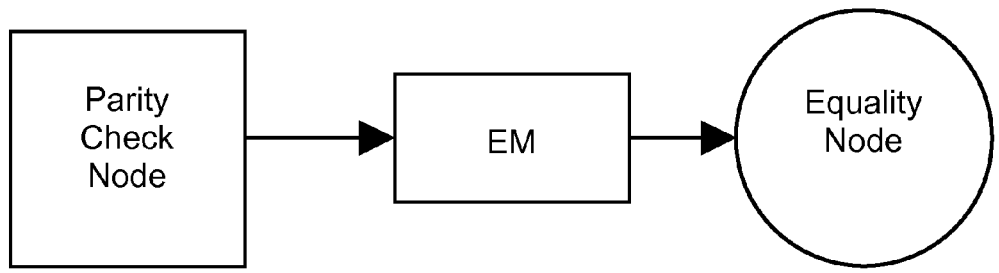
FIG. 9d is a simplified block diagram illustrating an edge memory for re-randomizing the stochastic stream according to an embodiment of the invention.

In other words, the EMs gather the incoming bits—any incoming bits or only regenerative bits—from the edge and only re-randomize them. The EMs for re-randomizing the stochastic stream are, optionally, placed at any location on the edges of the factor graph. For example, the EMs are electrically coupled to incoming edges of the equality nodes 110 as shown in FIG. 9*d*.

In operation, a set of encoded samples is received at the input port 102 for decoding—at 30. The set of encoded samples is representative of a sequence of information bits and parity bits generated using a linear code with parity check matrix such as a LDPC code. Using the processing circuitry 104, each of the encoded samples is then—at 32—converted into a corresponding probability. At 34, for each probability is then a corresponding probability message generated by encoding each probability as a sequence of digital bits. At 36, each probability message is received in a bitwise fashion at a respective equality node 110 and then passed—at 38—in a bitwise fashion through the factor graph while for each received bit the equality function is performed at the equality nodes 110 and the parity check function is performed at the parity check nodes 112. If an equality node 110 is in a hold state, a bit is chosen—at 40—from previous output bits of the equality node 110 stored in a corresponding memory 222. The previous output bits have been provided by the equality node 110 in a state other than a hold state. At 42, the memory 222 is updated when the equality node 110 in a state other than a hold state. As above, an estimated sequence of information bits in dependence upon the output bits provided by the equality nodes 110 is determined—at 44—and the steps 34 to 44 are repeated until a stopping criterion is satisfied.

It is noted, that the provision of a chosen bit from the EM in case an equality node 110 is in a hold state does not adversely affect the accuracy of the decoded information, since the stochastic decoding process comprises numerous repeated cycles until a stopping criterion is satisfied. However, this method substantially prevents an equality node or a group of equality nodes from being locked in a fixed state, thus overcoming to a substantial extent the "latching" problem.

Figure 11:
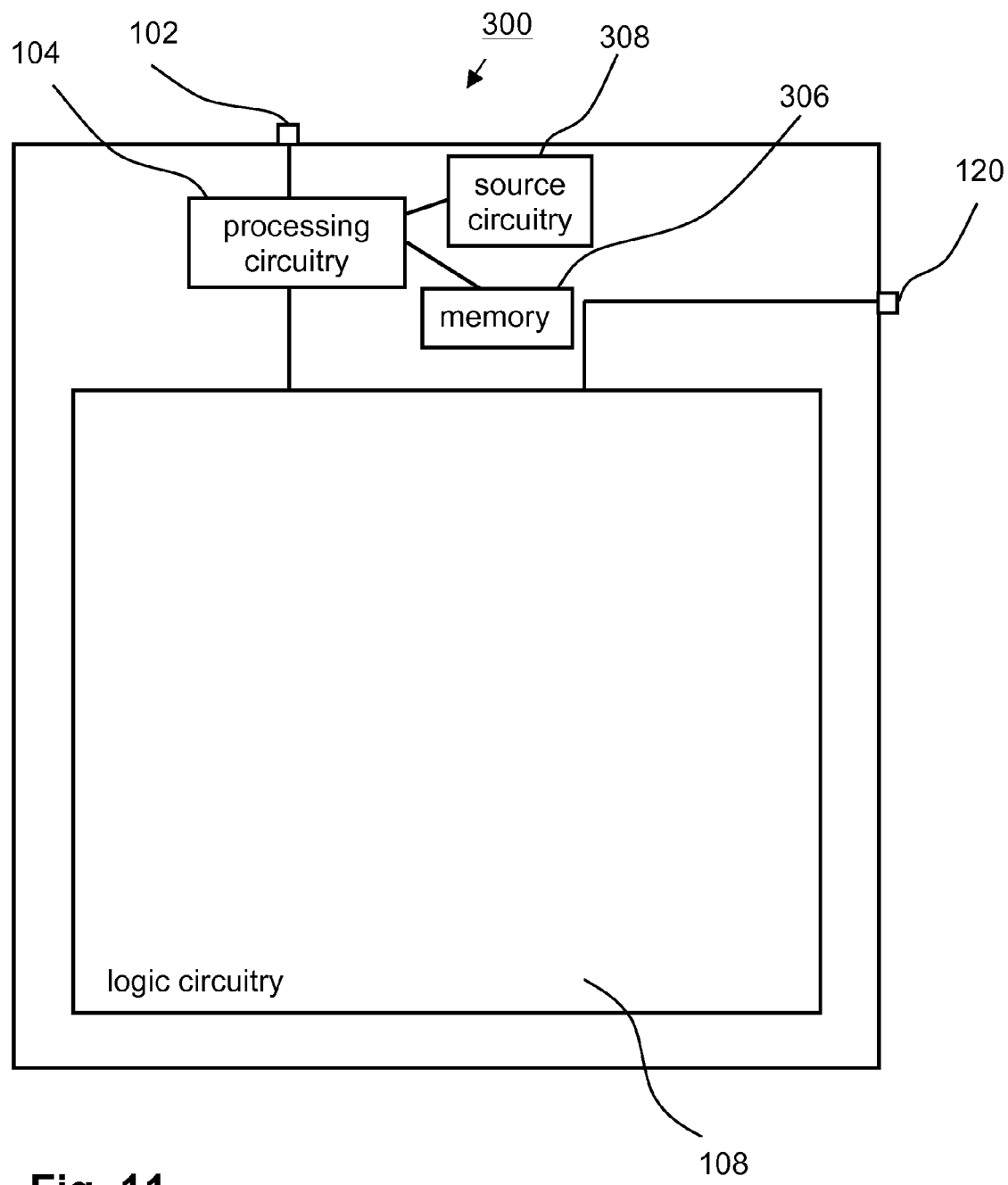
FIG. 11 is a simplified block diagram of a stochastic decoder according to an embodiment of the invention.
Figure 12:
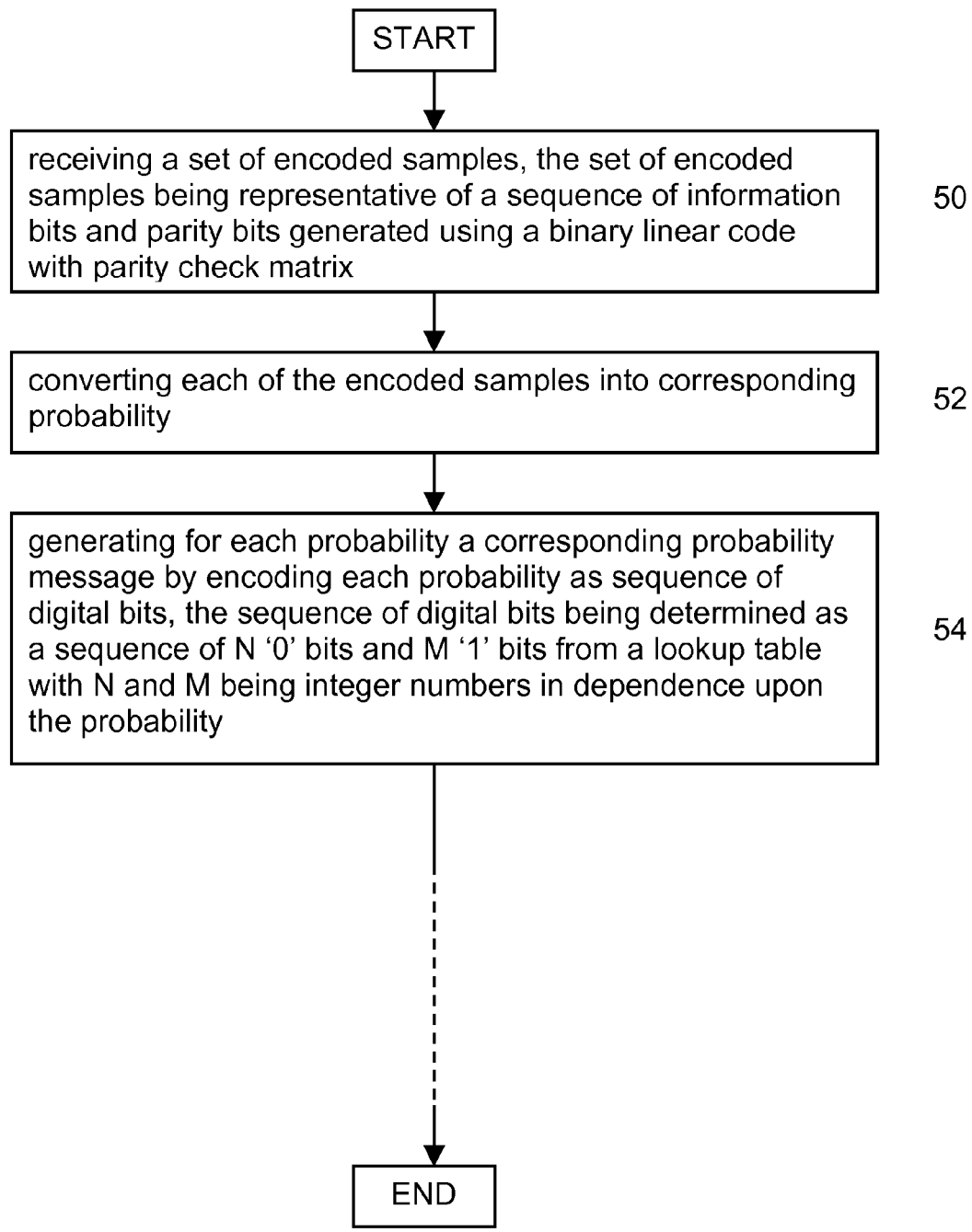
FIG. 12 is a simplified flow diagram of a method for stochastic decoding according to an embodiment of the invention for execution on the stochastic decoder shown in FIG. 11.

Referring to FIGS. 11 and 12, a simplified block diagram of an embodiment of a stochastic decoder 300 according to the invention, and a simplified flow diagram of an embodiment of a method for stochastic decoding according to the invention for execution on the stochastic decoder 300 are shown, respectively. The stochastic decoder 300 comprises same main components as the stochastic decoder 100 illustrated in FIG. 7*a*, except for memory 306 replacing the source circuitry 106. The memory 306 has stored a plurality of bit sets with each bit set comprising at least a bit. For example, the bit sets are stored in a form of a lookup table. Here, the processing circuitry 104 retrieves selected bit sets from the memory 306 and generates for each probability a corresponding probability message by encoding each probability as a sequence of digital bits with the sequence of digital bits being determined as a sequence of N '0' bits and M '1' bits with N and M being integer numbers in dependence upon the probability. Optionally, source circuitry 308, such as a LFSR, electrically coupled to the processing circuitry 104 is provided for enabling the processing circuitry 104 to select at least a portion of the bit sets in a pseudo-random fashion.

In operation, a set of encoded samples is received at the input port 102 for decoding—at 50. The set of encoded samples is representative of a sequence of information bits and parity bits generated using a binary linear code with parity check matrix such as a LDPC code. Using the processing circuitry 104, each of the encoded samples is then—at 52—converted into a corresponding probability. At 54, for each probability is then a corresponding probability message generated by encoding each probability as a sequence of digital bits from the bit sets stored in the memory 306. For example, the sequence of digital bits is generated by expanding a bit set selected from the plurality of bit sets by adding bits to the selected bit set or by concatenating the selected bit set with other bit sets selected from the plurality of bit sets stored in the memory. The following decoding process is the same as shown in FIG. 8—steps 22 to 28.

To ensure the correct number of '0' bits and '1' bits according to the probability to be encoded, the bit sets are selected in a deterministic fashion. Alternatively, a portion of the bit sets is selected in a pseudo-random fashion and the remaining bit sets are selected in a deterministic fashion to ensure the correct number of '0' bits and '1' bits. Further alternatively, a portion of the bit sets is selected in a pseudo-random fashion and the number of '0' bits and '1' bits of the remaining bits is determined and the remaining bits are added accordingly. Yet further alternatively, the bit sets are selected in a pseudo-random fashion, a sequence is generated and then examined if it contains the correct number of '0' bits and '1' bits. This process is repeated until a sequence with the correct number of '0' bits and '1' bits has been generated.

Optionally, the sequence is generated from the bit sets such that it comprises at least a predetermined number of bit transitions, with the number of bit transitions varying in dependence upon the probability.

The generation of the sequence of digital bits using a lookup table enables substantially faster generation of the sequences than use of a pseudo-random or random source, substantially increasing decoding speed. Secondly, it enables deterministic generation of sequences which is used, for example, for testing purposes. Thirdly, it enables generation of sequences having at least a predetermined number of bit transitions, thus reducing the likelihood of equality nodes becoming locked in a fixed state.

Alternatively, the probability messages are stored in the memory 306 and are provided in dependence upon a received encoded sample. For example, a plurality of predetermined probability messages is stored in the memory 306 with each probability message having a respective address corresponding to an encoded sample. Upon receipt of an encoded sample the probability message stored at the corresponding address is retrieved from the memory 306. Storing the probability messages in the memory 306 obviates the conversion into probabilities—at 52—and the generation of the probability messages—at 54—is reduced to retrieving of the same from the memory 306, thus processing speed is substantially enhanced. Optionally, the predetermination of the probability messages includes the determination of a scaling factor. Advantageously, such a process is deterministic in nature and is therefore more easily evaluated for quality assurance purposes.

Figure 13:
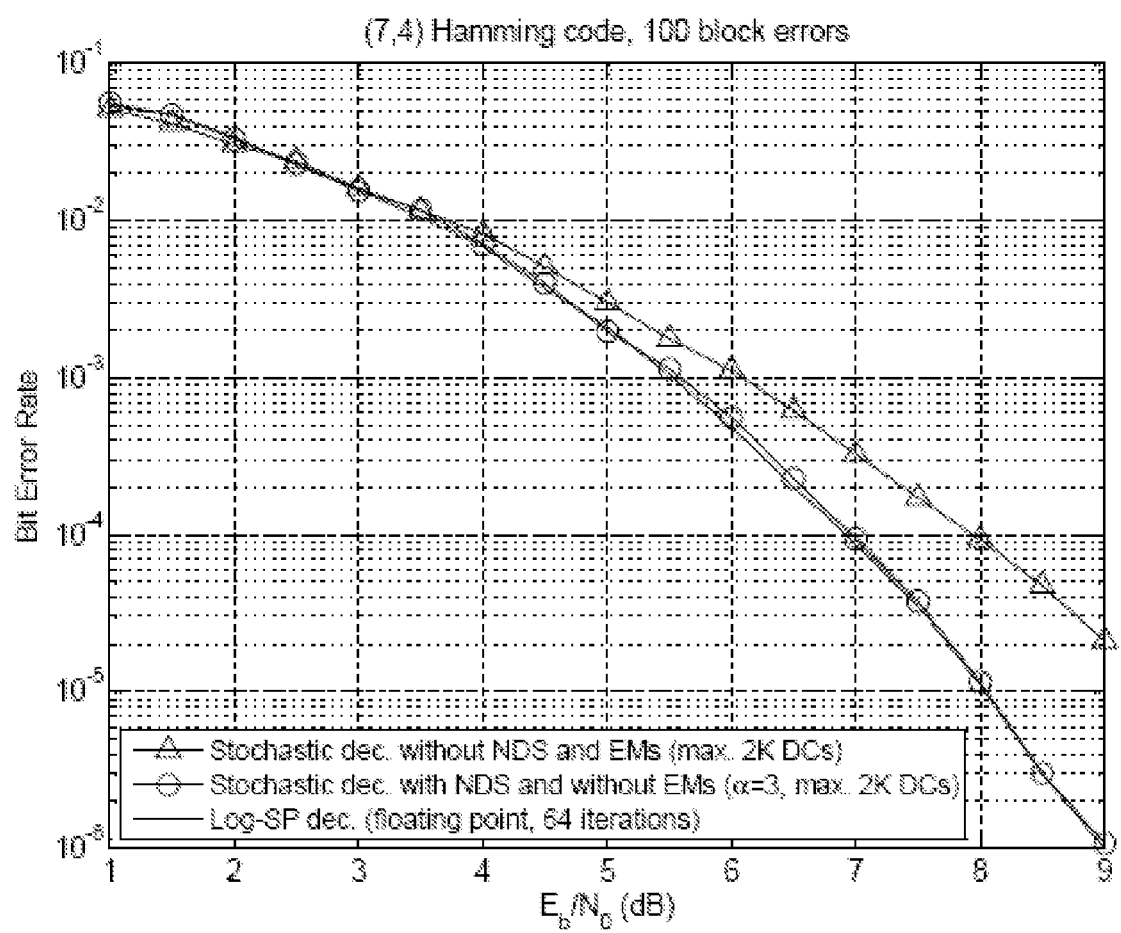
FIG. 13 is a diagram illustrating simulation results of the stochastic decoder according to an embodiment of the invention for a (7, 4) Hamming code.

FIG. 13 illustrates the BER performance of the first embodiment of the stochastic decoder according to the invention for a (7, 4) Hamming code with $\alpha=3$ and maximum 2K DCs. As shown, the NDS improves the performance of stochastic decoding and provides comparable performance for SNRs compared to SP decoding.

Figure 14:
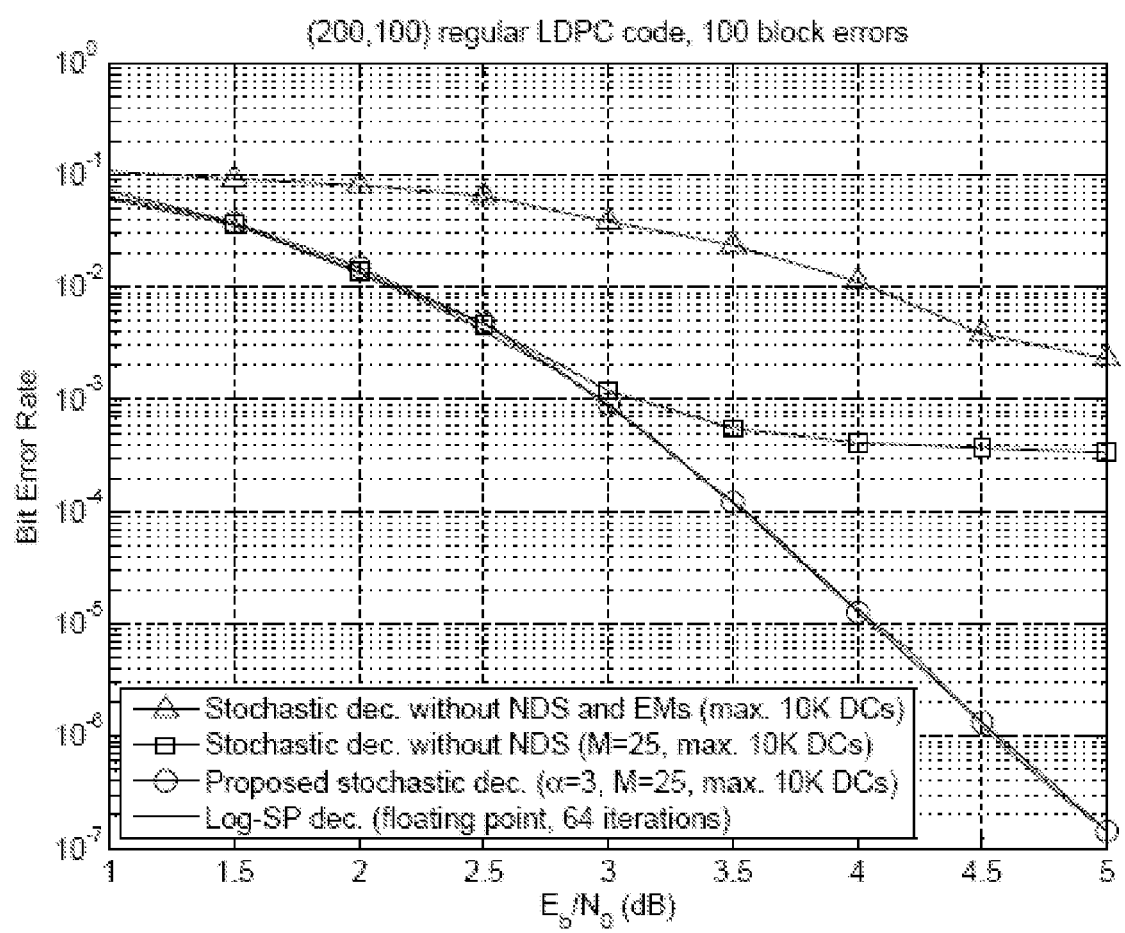
FIGS. 14 and 15 are diagrams illustrating simulation results of the stochastic decoder according to an embodiment of the invention for a (200, 100) LDPC code and for a (1024, 512) LDPC code, respectively.
Figure 15:
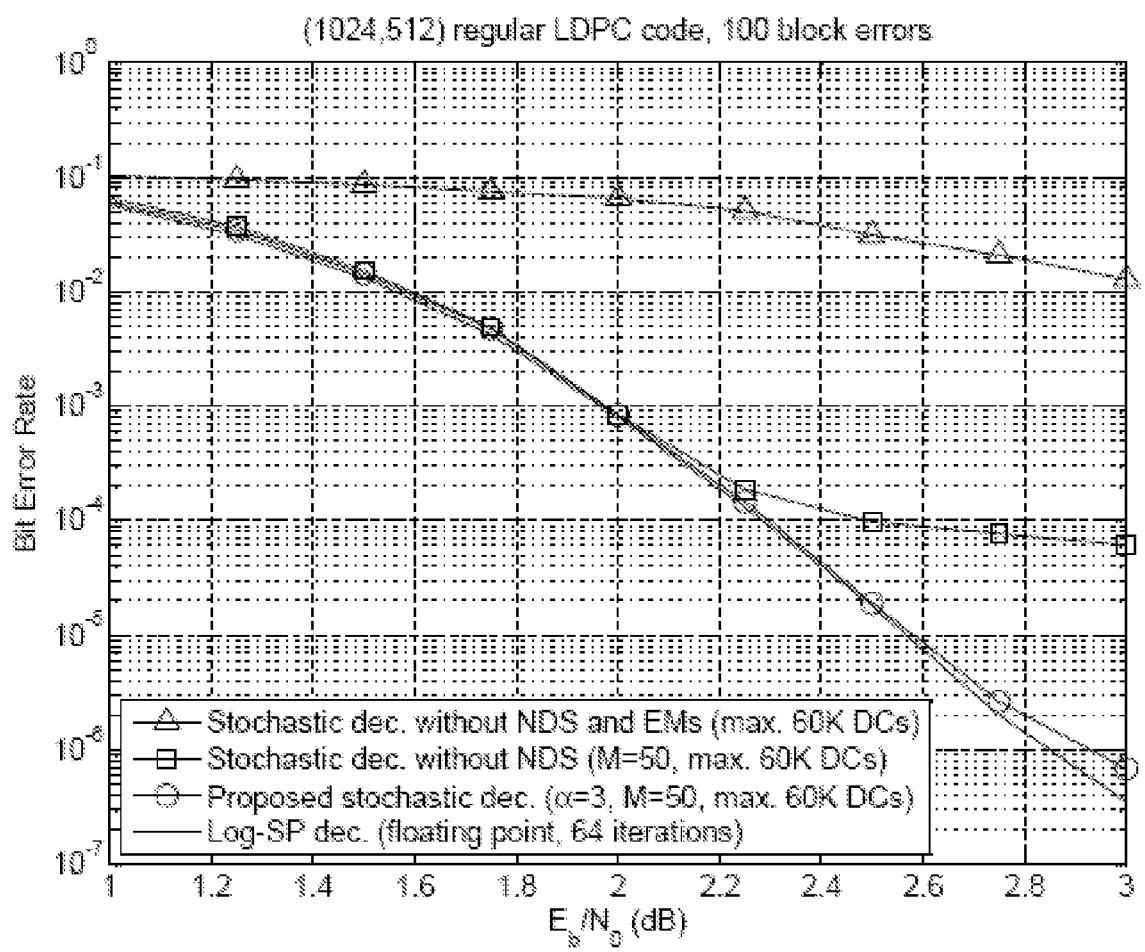

FIGS. 14 and 15 illustrate the BER performance of the stochastic decoder according to embodiments of the invention for (200,100) and (1024, 512) LDPC codes, respectively. Both codes are regular and 6-cycle-free with $d_e=3$ equality and $d_c=6$ parity check nodes. The SNR is defined as $E_b/N_0$ in dB, where $E_b$ denotes average energy per bit. M=25 and maximum 10K DCs has been used for decoding the (200,100) LDPC code and, M=50 and maximum 60K DCs for the (1024, 512) LDPC code. $\alpha=3$ has been used for both codes. As shown, with respect to the SP process with floating point implementation, a combination of the first and the second embodiment provides comparable BER performance for the (200,100) LDPC code and near-optimal performance for the (1024, 512) LDPC code. The DCs per block are substantially less than the maximum DCs. For example, the average DCs for the (200,100) LDPC code is about 200 at the BER of $10^{-7}$ and for the (1024, 512) LDPC code it is about 6K at the BER of $10^{-5}$. Again, it is noted that the DCs are not equivalent to the iterations in the SP process and due to the low hardware complexity of the stochastic decoder according to the invention, the clock rate is substantially higher than that in a fixed point SP process decoder.

To illustrate the performance contribution of NDS and EMs, results for (i) decoding without NDS and EMs and, (ii) decoding with EMs but without NDS are also depicted in FIGS. 14 and 15. The contribution of EMs is observed by comparing results for case (i) with (ii). Also the contribution of NDS at higher SNRs is easily observed by comparing the results of the combination of the first and second embodiment with case (ii).

The above embodiments of the stochastic decoder according to embodiments of the invention and combinations thereof provide stochastic decoding on factor graph of state-of-the-art LDPC codes while substantially reducing the "latching" problem. The stochastic decoders according to embodiments of the invention achieve high performance at high-speed while enabling implementation using low-complexity hardware. For example, the stochastic decoder according to the invention is implementable in one of a partially-parallel and a fully-parallel fashion on a single semiconductor chip or on a Field Programmable Gate Array (FPGA).

Figure 16:
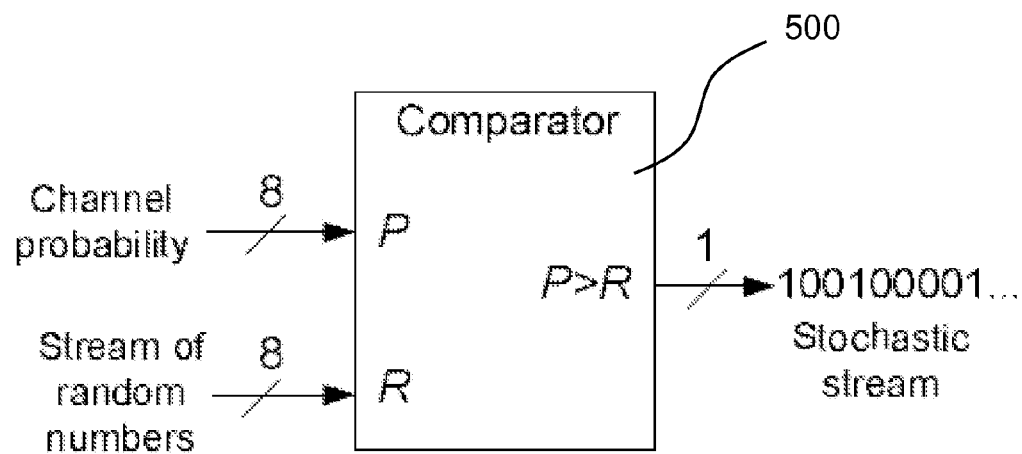
FIG. 16 is a simplified block diagram illustrating conversion of a channel probability into a corresponding probability message.

As an example, a fully-parallel implementation of a (1024, 512) stochastic LDPC decoder on a FPGA according to an embodiment of the invention is described hereinbelow. Upon receiving a block of symbols the NDS is applied according to equation (8). Good stochastic BER decoding performance is achieved for the (1024, 512) stochastic LDPC decoder by using $\alpha=3$ and $Y=6$, i.e. $4\alpha/Y=2$. Therefore, probabilities are easily generated based on 1-bit shifted received values. The (1024, 512) stochastic LDPC decoder is implemented using a 8-bit representation for the received channel probabilities. Each probability is encoded as a sequence of digital bits for generating a corresponding probability message, as shown in FIG. 16. A comparator 500 compares the channel probability P with one of a random and pseudo-random sequence of digital bits R—with a uniform distribution—at each DC. The channel probability P is fixed during the decoding of a block, while the one of a random and pseudo-random sequence of digital bits R is updated for each DC. An output bit of the comparator 500 is equal to 1 if P>R and is equal to 0 otherwise. The output bit of the comparator 500 is then fed to an equality node 110. Since R has a uniform distribution and a range of values from 0 to $2^8-1$, each bit in the output stochastic stream is equal to 1 with a probability of $P/2^8$. The decoder comprises one comparator 500 for each equality node 110. R is generated using a randomization engine which is described below.

Figure 17:
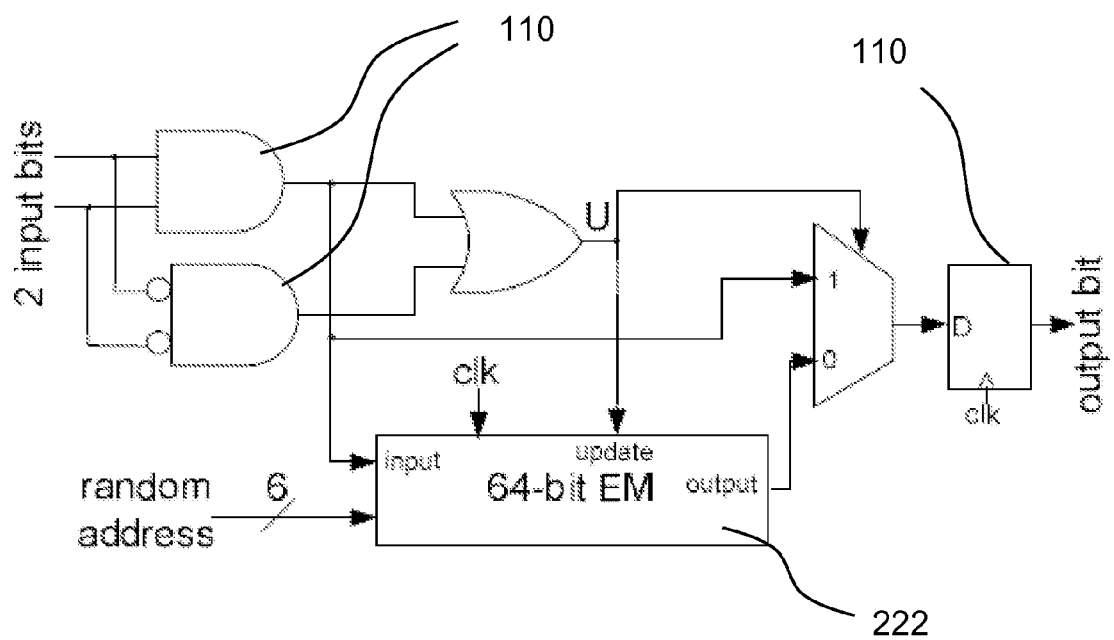
FIG. 17 is a simplified block diagram illustrating a degree-3 equality node with EM according to an embodiment of the invention.

The (1024, 512) stochastic LDPC decoder comprises one EM 222 per edge of each equality node 110. The EMs 222 operate as M-bit shift registers with a—single—bit being selectable by address lines in each DC. FIG. 17 shows a simplified block diagram of a $d_e=3$ equality node 110 having 2 input ports and one output port. When the input bits of the equality node 110 are equal, the U signal is 1 and the equality node 110 applies the equality equation for determining the outgoing bit for the edge. In this case, the equality node updates the EM in a First-In-First-Out (FIFO) fashion. In case of a hold state—i.e. when the input bits are not equal—U is 0 and the EM is not updated. Instead, a bit is one of randomly and pseudo-randomly selected from the EM and used as the outgoing bit. The one of random and pseudo-random selection of a bit from an EM is done by generating one of a random and pseudo-random address for each EM in each DC using a randomization engine which is described below. For the hardware implementation of the (1024, 512) stochastic LDPC decoder EMs with M=64 are used. The decoder comprises $1024 \times d_e = 3072$ 64-bit EMs. Modern FPGA architectures allow efficient implementation of the EMs by using small Look-Up Tables (LUTs) as Shift Register LUTs (SRLs) and accessing a single bit in the register. Optionally, a plurality of SRLs are cascaded to form shift registers of larger size. For example, using a "Xilinx Virtex-4" FPGA, a 64-bit EM is implemented by cascading four 4-input LUTs. Each 4-input LUT forms a 16-bit shift register with a single output accessed by the LUT's address line. Such a 64-bit EM occupies only 2 slices of the Xilinx Virtex-4 FPGA.

As described above, the output bits of each equality node 110 is passed to an up/down counter 114 at the end of each DC, i.e. the (1024, 512) stochastic LDPC decoder comprises one counter 114 for each equality node 110. Here, 6-bit signed saturation up/down counters—counting from −31 to 31—are used. The saturation up/down counters is incremented in case of receiving 1 and decremented in case of 0. It stops decrementing/incrementing when it reaches its minimum/maximum limits. The sign of the counter indicates the hard-decision at each DC.

The randomization engine is used for generating one of random and pseudo-random probabilities for the comparators 500 as well as for generating one of random and pseudo-random addresses for the EMs. Optionally, the random or pseudo-random numbers are shared at two levels without significant loss in decoder BER performance: (i) bits in random or pseudo-random numbers generated for the comparators are used for selecting addresses of the EMs and, (ii) different groups of EMs share the same randomly or pseudo-randomly selected address. The randomization engine comprises ten 16-bit Linear Feedback Shift Registers (LFSRs) with each LFSR being associated with a prime polynomial. Each bit in an output random or pseudo-random number is generated by performing an XOR function on a different bit of the ten LFSRs. The randomization engine generates 32 8-bit random or pseudo-random numbers in each DC for the entire decoder.

Figure 18:
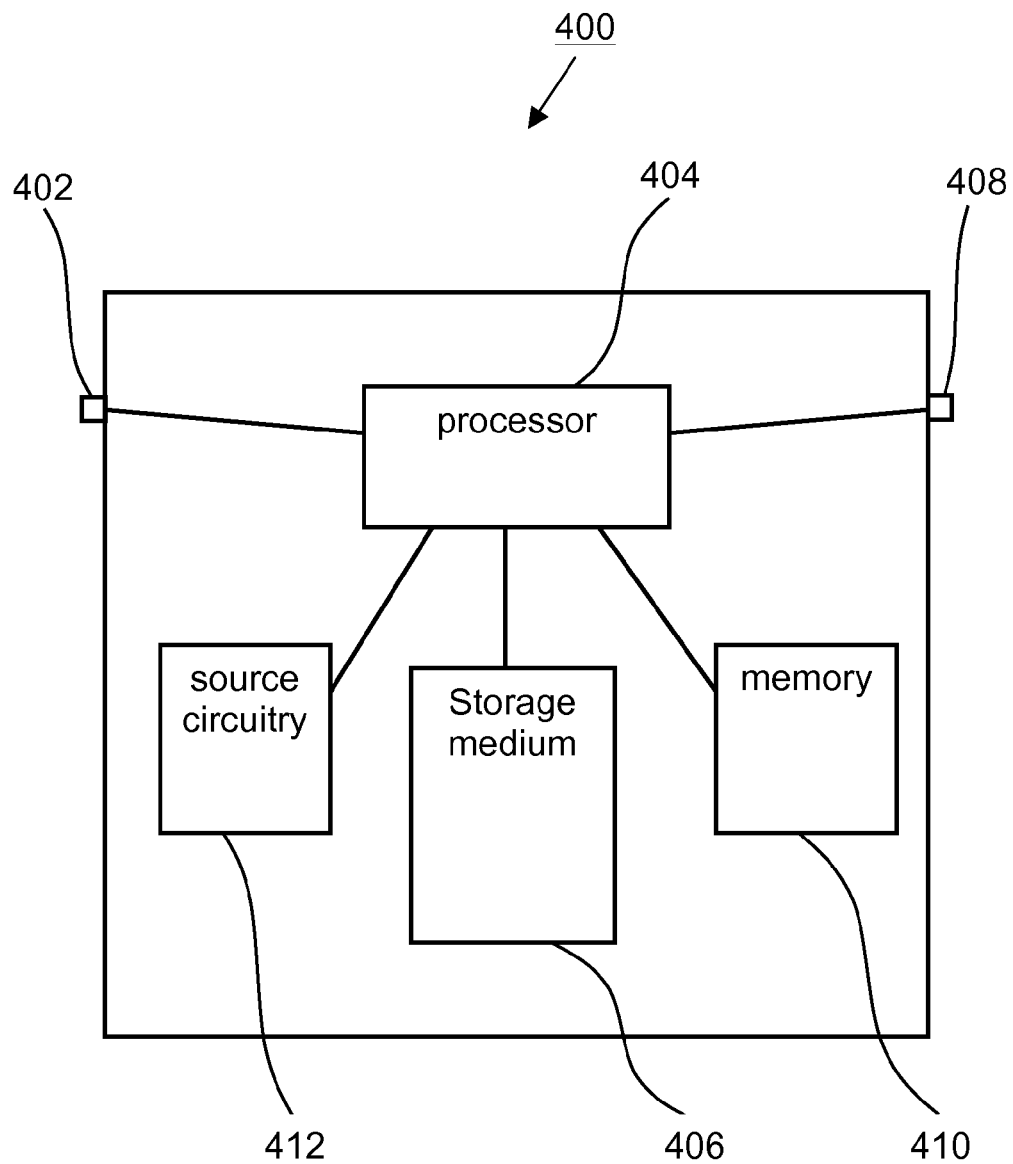
FIG. 18 is a simplified block diagram of a stochastic decoder according to an embodiment of the invention.

The above embodiments of a method for stochastic decoding according to the invention are also implementable by executing commands on a processor. Referring to FIG. 18, a simplified block diagram of an embodiment of a stochastic decoder 400 is shown. A set of encoded samples is received at the input port 402. Using electronic circuitry such as a processor 404 the signal data are then digitally processed. The decoder 400 comprises a storage medium 406 having stored therein executable commands for execution on the processor 404 for performing the stochastic decoding corresponding to one of the above processing methods. Alternatively, the processor 404 comprises electronic circuitry designed for performing at least a portion of the signal processing in a hardware implemented fashion. Further alternatively, the decoder 400 comprises a plurality of processors for parallel execution of the stochastic decoding process. The system 400 further comprises an output port 408 for providing the estimated sequence $\hat{x}$. Optionally, the decoder 400 comprises at least a memory 410 for storing at least one of the output bits, bit sets, and probability messages. Further optionally, the decoder 400 comprises a source circuitry 412 for providing digital bits in one of a pseudo-random and random fashion.

The factor graphs of numerous error correcting codes such as, for example, some LDPC codes, RS codes, BCH codes, and Turbo-Product codes comprise high-degree equality nodes. As the degree of the equality node increases, the likelihood of the equality node being in a hold state also increases, because it is less likely to have equal input bits with an increasing number of input ports. Therefore, a high-degree equality node is likely in a hold state. Using EMs an outgoing bit is selected from the EM when the equality node is in a hold state. However, use of the EM repeats previous output bits and results in less switching activity or poorer convergence. During decoding, a high-degree equality node refers to its previous output bits substantially more often than a low-degree equality node. Therefore, a change of input bits in a high-degree equality node is reflected to the output bit with substantially more latency than in a low-degree equality node, which also increases the likelihood of latching. As a result the decoding performance is substantially decreased for error correcting codes comprising high-degree equality nodes.

Figure 19A:
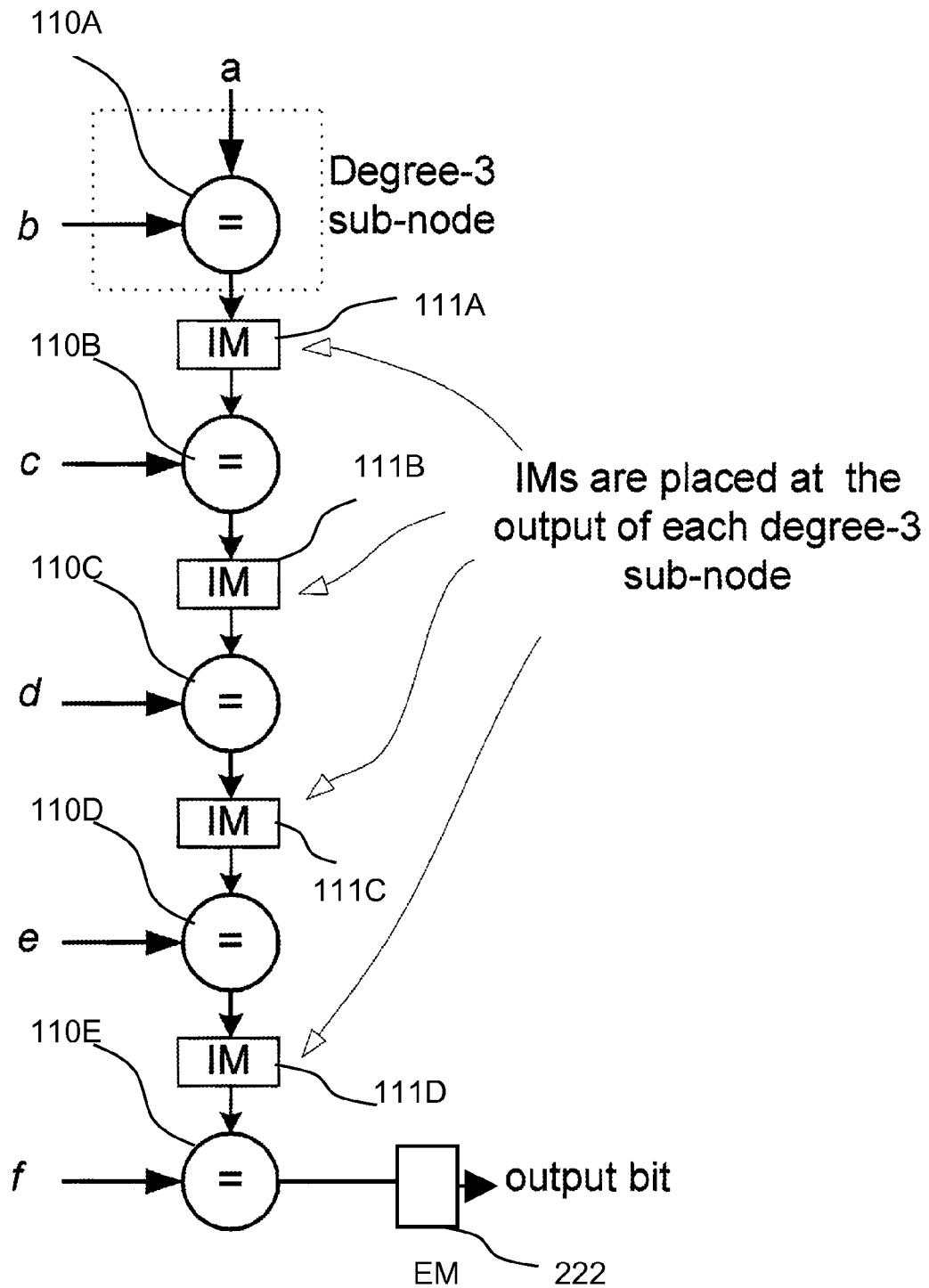
FIGS. 19a and 19b are simplified block diagrams illustrating degree-7 equality nodes with 1M according to an embodiment of the invention.
Figure 19B:
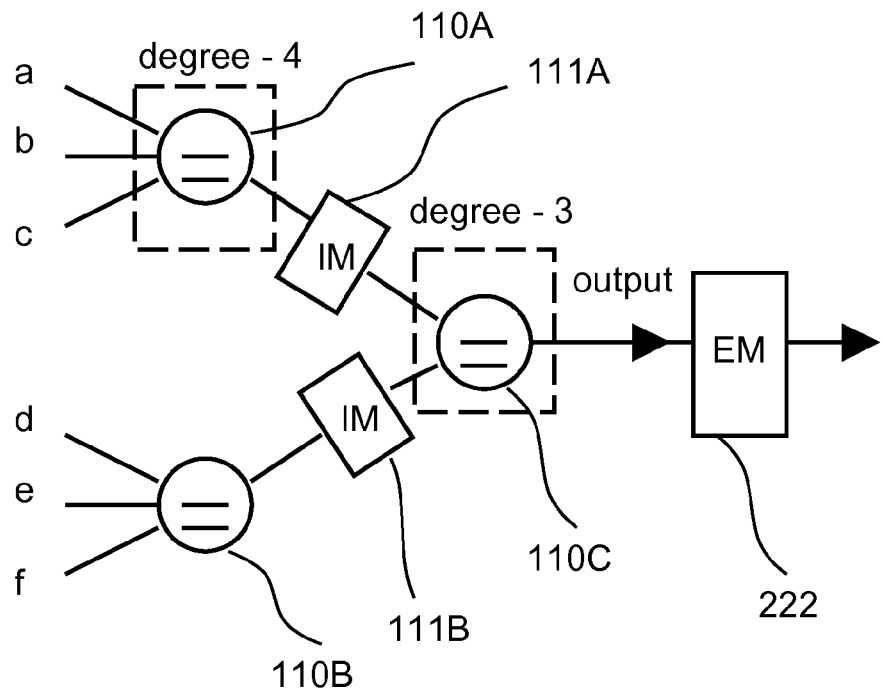

According to an embodiment of the invention, high-degree equality nodes are partitioned into a plurality of lower-degree equality "sub-nodes"—for example, degree-3 or degree-4 sub-nodes—with each lower-degree sub-node having an Internal Memory (IM) placed at its output port when output port is electrically coupled to an input port of a following sub-node. Referring to FIGS. 19a and 19b, simplified block diagrams of a 7-degree equality node 110 according to an embodiment of the invention are shown. There are various possibilities for partitioning a high-degree equality node. For example, the 7-degree equality node is partitioned into 5 degree-3 sub-nodes 110A to 1110E, shown in FIG. 19a, or into 2 degree-4 and one degree-3 sub-nodes 110A to 110C, shown in FIG. 19b. Accordingly, 4 IMs 111A to 111D are placed at a respective output port of the first four degree-3 sub-nodes 110A to 110D in FIG. 19a, and 2 IMs 111A and 111B are placed at a respective output port of the first two degree-4 sub-nodes 110A and 110B in FIG. 19a. The operation of the IMs is similar to the one of the EMs. The difference is that the EM is placed at the output edge electrically coupled to an equality node and is used to provide an output bit for the entire equality node, while the IM is used to provide an output bit for only a sub-node within the equality node. The operation of a sub-node is then as follows:

1) When all input bits of the sub-node are equal, the sub-node is in the regular state, using the equality operation on the input bits to calculate the output bit. The IM is updated with the new output bit, for example, in a FIFO fashion.
2) When the input bits are not equal, the equality sub-node is in the hold state. In this case a bit is randomly or pseudo-randomly selected from the previous output bits stored in the IM and provided as the new output bit. The IM is not updated in the hold state.

Figure 19C:
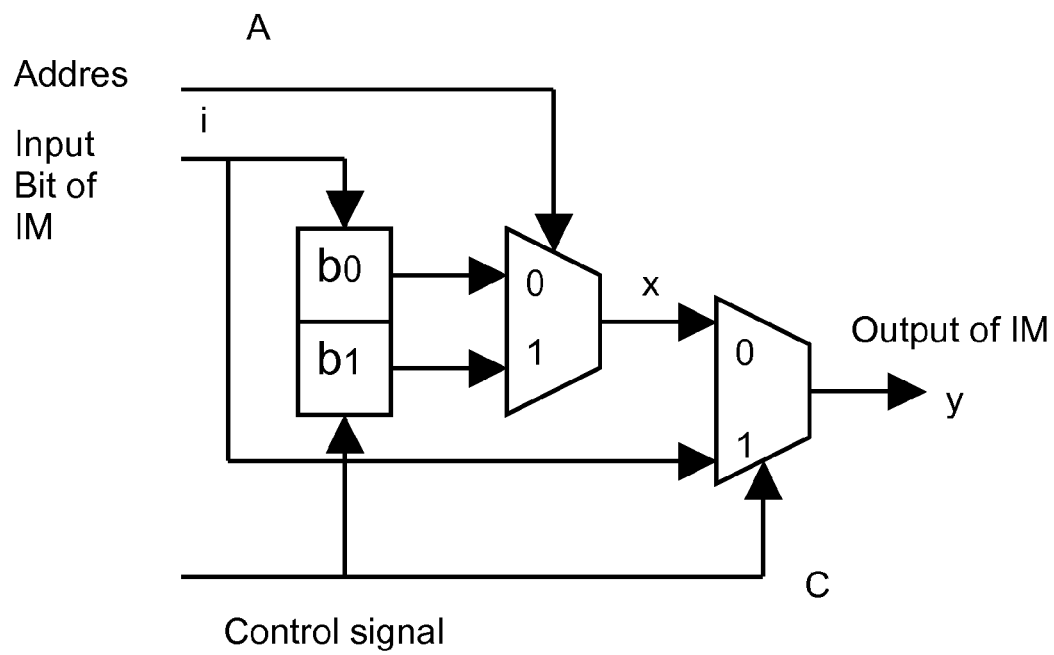
FIG. 19c is a simplified block diagram illustrating a 2-bit IM according to an embodiment of the invention.

An example of an IM is shown in FIG. 19c illustrating in a simplified block diagram a 2-bit IM based on a 2-bit shift register. When the sub-node is in the hold state control signal C is 0. In the hold state the bits in the shift register are hold, i.e. $b_0=b_0$ and $b_1=b_1$. The output bit of the equality sub-node is then randomly or pseudo-randomly selected from the IM, i.e. when address A=0 then is $x=b_0$ which is provided as output bit y, and when A=1 then is $x=b_1$ which is provided as output bit. When the sub-node is in the regular state the control signal C is 1. In the regular state the bit i is calculated by the equality sub-node and provided as output bit y. The IM is updated with the bit i in FIFO fashion, i.e. $b_0=i$ and $b_1=b_0$.

Figure 19D:
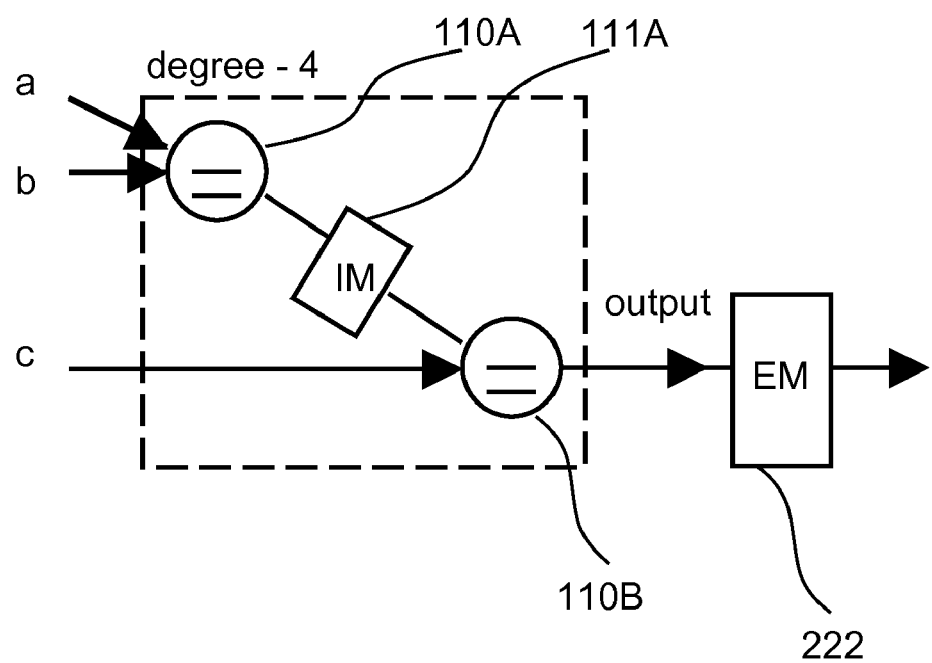
FIG. 19d is a simplified block diagram illustrating a degree-4 equality node with 1M according to an embodiment of the invention.

Different sub-node structures introduce different levels of switching activity and, hence, result in different BER performance of the decoder. For example, a sub-node structure is determined based on an optimized BER performance of the decoder for a given code and size. Optionally, a bit is selected from the IM using other methods such as, for example, round-robin. Further optionally, the IMs are employed for use in lower-degree equality nodes in order to improve the BER performance. For example, a degree-4 equality node is partitioned into two degree-3 equality sub-nodes 110A and 110B having one IM 111A placed at the output port of the first equality sub-node 110A, as shown in FIG. 19d.

According to an embodiment of the invention, counter circuitries are employed to perform the function of the EMs and IMs, i.e. re-randomization and de-correlation of the probability messages within the factor graph. The counter is incremented by a step-size SI when the output bit of the corresponding equality node or equality sub-node is 1, and is decremented by a step-size SD when the output bit is 0, or vice versa. The counter is, for example, implemented as a saturation up/down counter which stops incrementing when it reaches a maximum limit C_MAX and stops decrementing when it reaches a minimum limit C_MIN. The output bit of the counter circuitry is determined according to the content of the counter at a DC. For example, if a counter counts from C_MIN=0 to C_MAX=100 and its content is C=30 at a DC the output bit is 1 with a likelihood of 30/100=30%. This is realized, for example, by using a comparator which compares C with a randomly or pseudo-randomly generated sequence of digital bits R, where 0<R<100. If C>R, the output bit is 1 otherwise it is 0.

Referring to FIGS. 20a to 20e, various counter circuitries for use as EMs or IMs according to embodiments of the invention are shown. The counter circuitry 700 shown in FIG. 20a comprises a counter 702 electrically coupled to a comparator 704 and a feedback line to the counter electrically coupled to node 706, which is interposed between the counter 702 and the comparator 704, and comprises a mixer 708. The operation of the counter circuitry is then as follows:
1) When the equality node or sub-node is in the regular state a regenerative bit x is received at the counter 702 and the content of the counter is updated providing $C_{t+1}$ as:

$C_{t+1}=C_t+SI+AC_t$, when $x=1$; and, $C_{t+1}=C_t-SD+AC_t$, when $x=0$; and, wherein A is an address provided to the mixer 708.
2) When the equality node or sub-node is in the hold state the content $C_t$ is provided to the K input port of the comparator 704 and compared with a random or pseudo-random sequence of digital bits R. The output bit y is then determined in the comparator as:

y=0, when $R \geq K$; and y=1, when $R<K$.

Figure 20A:
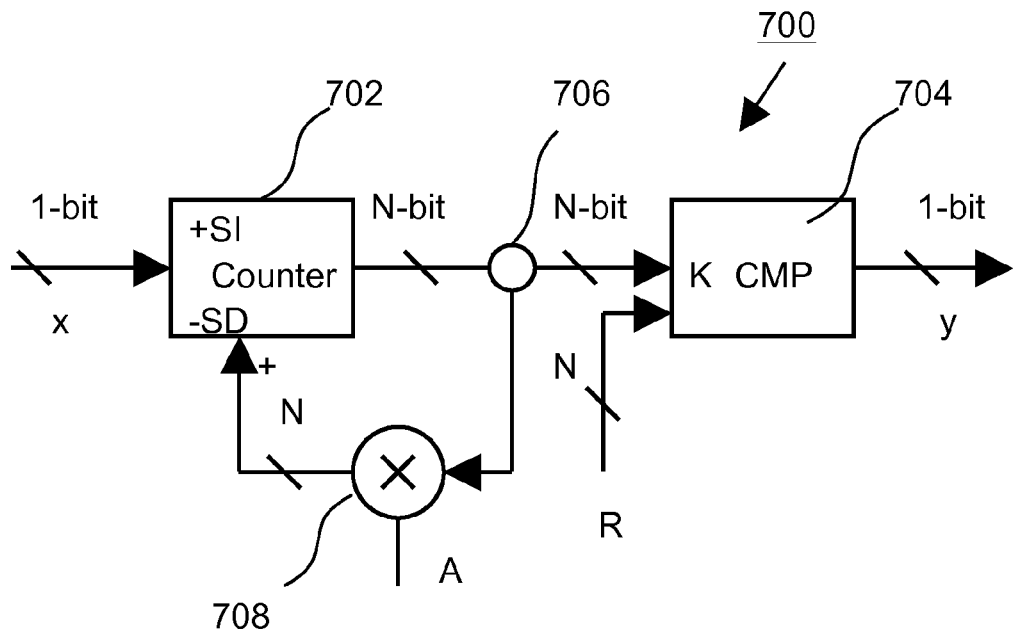
FIGS. 20a to 20e are simplified block diagrams illustrating various counter circuitries for use as EMs or IMs according to embodiments of the invention.
Figure 20B:
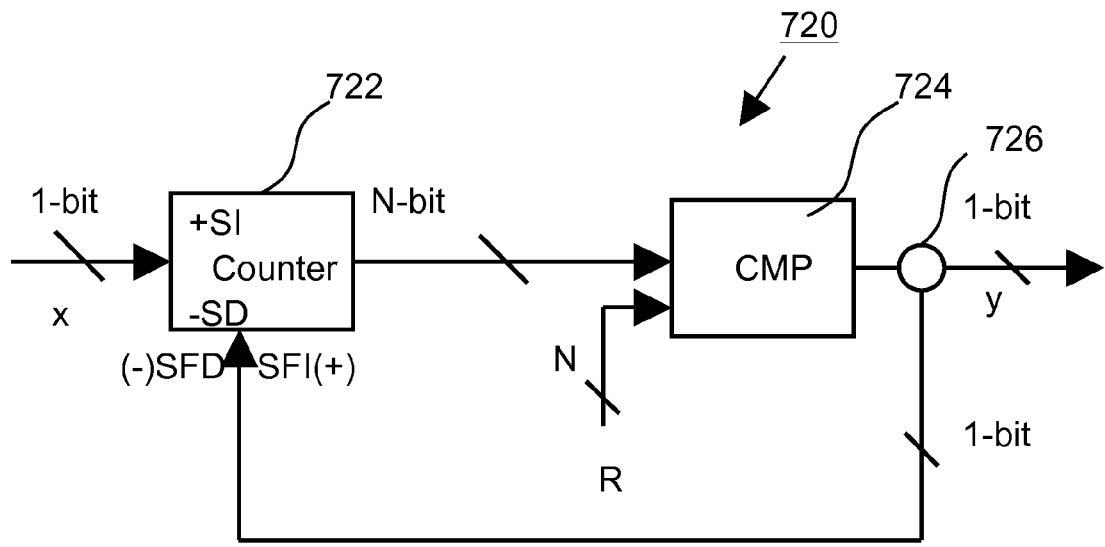

The counter circuitry 720 shown in FIG. 20b comprises a counter 722 electrically coupled to a comparator 724 and a feedback line to the counter electrically coupled to node 726 at the output port of the comparator 724. In the regular state of the equality node or sub-node a regenerative bit x is received at the counter 702 and the content of the counter is updated providing $C_{t+1}$ as:

$C_{t+1}=C_t+SI+SFI$, when $x=y=1$;

$C_{t+1}=C_t+SI-SFD$, when $x=1,y=0$;

$C_{t+1}=C_t-SD+SFI$, when $x 0$, $y=1$; and, $C_{t+1}=C_t-SD-SFD$, when $x=y=0$, wherein SFI is the feedback line step-size to increment the counter 722, and SFD is the feedback line step-size to decrement the counter 722.

In the hold state of the equality node or sub-node the operation of the counter circuitry 720 is the same as the one of the counter circuitry 700 shown in FIG. 20a.

Figure 20C:
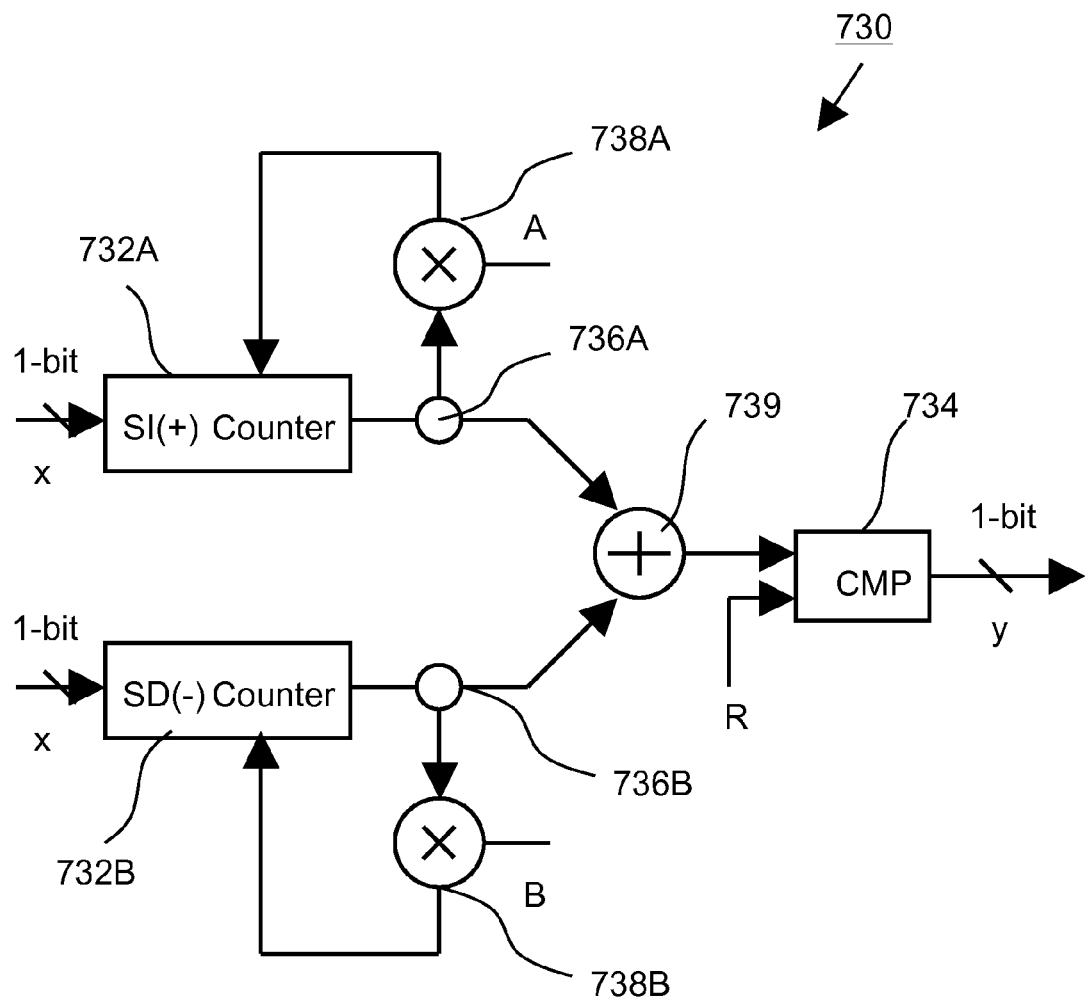

The counter circuitry 730 shown in FIG. 20c is similar to the counter circuitry 700, shown in FIG. 20a. Here two counters 732A and 732B are used, the up counter 732A for receiving x=1 bits, and the down counter 732B for receiving x=0 bits. Each of the two counters 732A, 732B comprises a feedback line electrically coupled to nodes 736A and 736B, with a mixer 738A, 738B, respectively. The output ports of the counters 732A and 732B are electrically coupled to the K input port of the comparator 734 via sum unit 739. The operation of the counter circuitry 730 is the same as the one of the counter circuitry 700, shown in FIG. 20a.

Figure 20D:
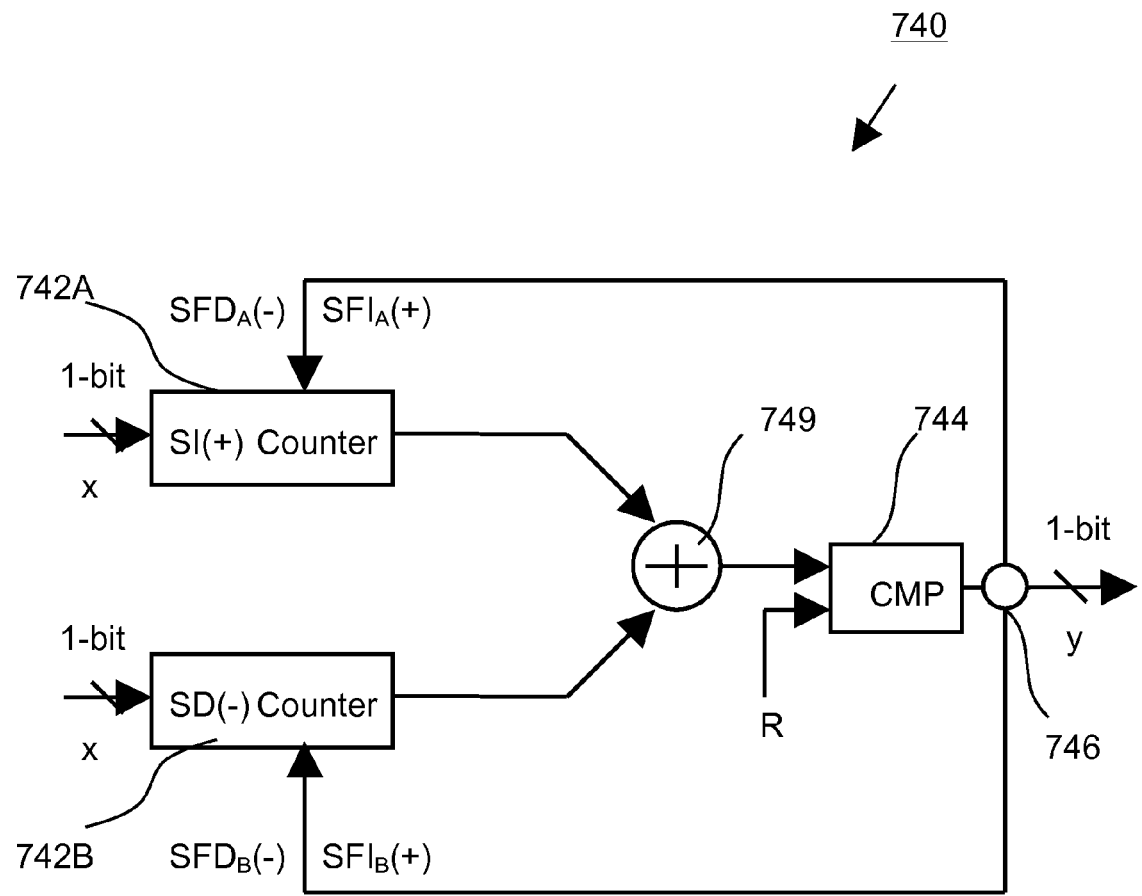

The counter circuitry 740 shown in FIG. 20d is similar to the counter circuitry 710, shown in FIG. 20b. Here, two counters 742A and 742B are used, the up counter 742A for receiving x=1 bits, and the down counter 742B for receiving x=0 bits. Each of the two counters 742A, 742B comprises a feedback line electrically coupled to node 746 at the output port of the comparator 744. The output ports of the counters 742A and 742B are electrically coupled to the K input port of the comparator 744 via sum unit 749. The operation of the counter circuitry 740 is the same as the one of the counter circuitry 710, shown in FIG. 20b.

Figure 20E:
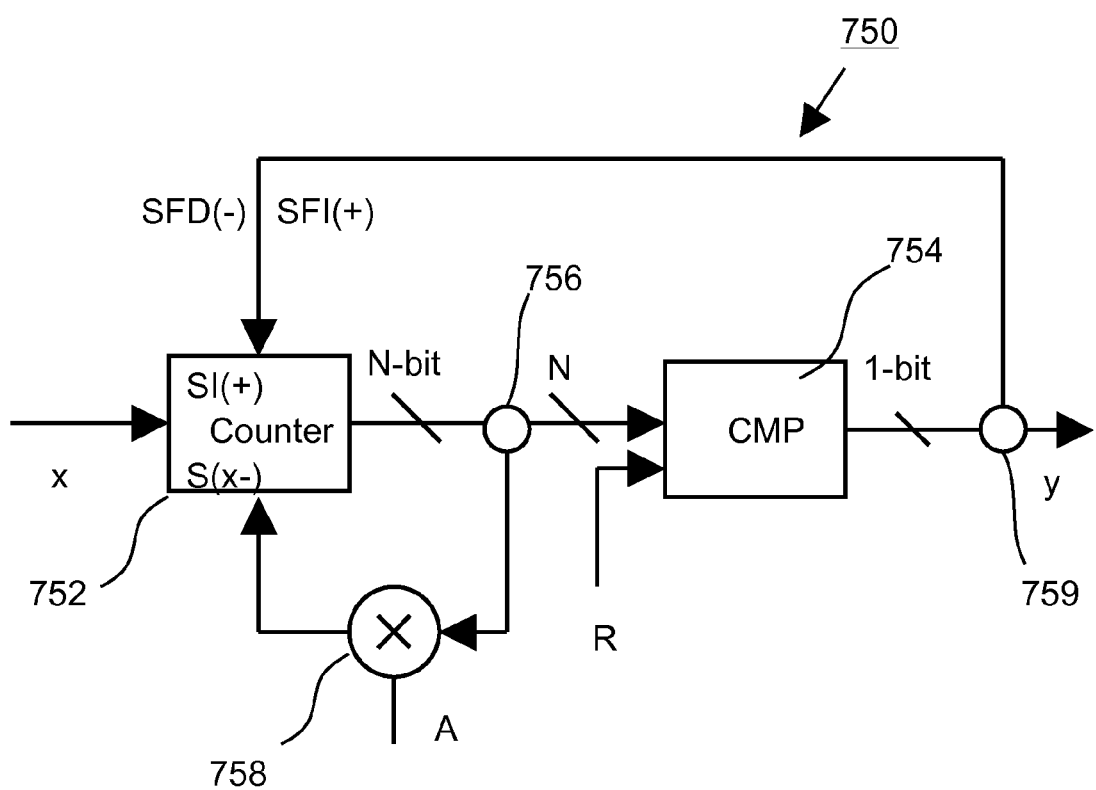

The counter circuitry 750 shown in FIG. 20e is a combination of the counter circuitries 700 and 710, shown in FIGS. 20a and 20b, respectively, comprising two feedback lines. The first feedback line to up/down counter 752 is electrically coupled to node 756, which is interposed between the counter 752 and comparator 744, and comprises a mixer 758. The second feedback line to the counter 752 is electrically coupled to node 759 at the output port of the comparator 754. In the regular state of the equality node or sub-node a regenerative bit x is received at the counter 752 and the content of the counter is updated providing $C_{t+1}$ as:

$C_{t+1}=C_t+SI+AC_t+SFI$, when $x=y=1$;

$C_{t+1}=C_t+SI+AC_t-SFD$, when $x=1,y=0$;

$C_{t+1}=C_t-SD+AC_t+SFI$, when $x=0,y=1$; and, $C_{t+1}=C_t-SD+AC_t-SFD$, when $x=y=0$.

In the hold state of the equality node or sub-node the operation of the counter circuitry 750 is the same as the one of the counter circuitry 700 shown in FIG. 20a.

It is noted that there are various other counter circuitries implementable as EMs and IMs. Selection of the appropriate counter circuitries is dependent on the provision of sufficient switching activity or convergence for a selected code and size. Additionally, it is possible to increment and decrement the counters using different step-sizes, for example, SI=4 and SD=2. Optionally, the step-sizes are changed during the decoding operation, as well as switch feedback lines ON/OFF or to switch feedback lines, for example, from negative feedback—output bit—to positive feedback—content using a switching mechanism disposed, for example, in the nodes 706, 726, 756, and 759. Further optionally, different counter circuitries are used for different nodes in the factor graph, as well as different counter configurations—for example, different size, different C_MAX and C_MIN, different SI and SD.

Employment of the counter circuitries for EMs and IMs substantially reduces used chip area as well as power consumption. For example, for each of 3000 EMs in a factor graph of an error correcting code, a 6-bit counter is used instead of a 64-bit shift register, resulting in a reduction of 3000×(64-6)=174,000 memory elements—approximately 90% improvement.

Reed-Solomon (RS) codes are non-binary linear block codes whose symbols are chosen from a Galois Field (GF). Good minimum distance of RS codes together with their non-binary nature result in good bit and burst error-correcting performance. RS codes are employed in a wide spectrum of applications including magnetic recording, media transmission and satellite communication. In the following, the stochastic decoding method and decoder disclosed above is extended for decoding RS codes by incorporating the stochastic decoding with its bit-serial nature into a reliability-based parity check matrix adaptation technique used for iterative Soft-Input Soft-Output (SISO) RS decoding. Furthermore, the stochastic decoding method and decoder disclosed above is extendable to non-adaptive RS decoding techniques such as RS decoding based on redundant factor graphs. While the stochastic decoding method and decoder is described for decoding an RS code for simplicity, it will become evident to those skilled in the art that the stochastic decoding method and decoder is not limited thereto but also applicable for decoding other linear block codes such as, for example, Golay codes and BCH codes.

The parity check matrix of an (n, k) RS code over GF ($2^m$) is represented by:

$$H = \begin{bmatrix} 1 & \beta & \ldots & \beta^n \\ 1 & \beta^2 & \ldots & \beta^{2(n-1)} \\ \vdots & \vdots & \ldots & \vdots \\ \vdots & \vdots & \ldots & \vdots \\ \vdots & \vdots & \ldots & \vdots \\ 1 & \beta^{(d-1)} & \ldots & \beta^{(d-1)(n-1)} \end{bmatrix}, \quad (9)$$

where $\beta$ is the primitive element in GF ($2^m$) and $d_{min}$=n−k+1 is the minimum distance of the code. This code is able to correct up to t symbols, where t=[($d_{min}$−1)/2]. In SP process based iterative RS decoding the parity check matrix H is expanded to its binary representation, $H_b$, by substituting each codeword in the GF ($2^m$) with its equivalent binary representation. This binary representation transforms the problem of RS decoding to the general problem of decoding of a (N,K) binary linear block code, where N=m×n and K=m×k. However, since the binary parity check matrix $H_b$ is usually dense, the SP process is not directly applicable to $H_b$. Therefore, at each iteration step of RS decoding two steps are performed:

1) reliability-based adaptation of the binary parity check matrix $H_b$; and, 2) generation of extrinsic information using the SP process.

Figure 21:
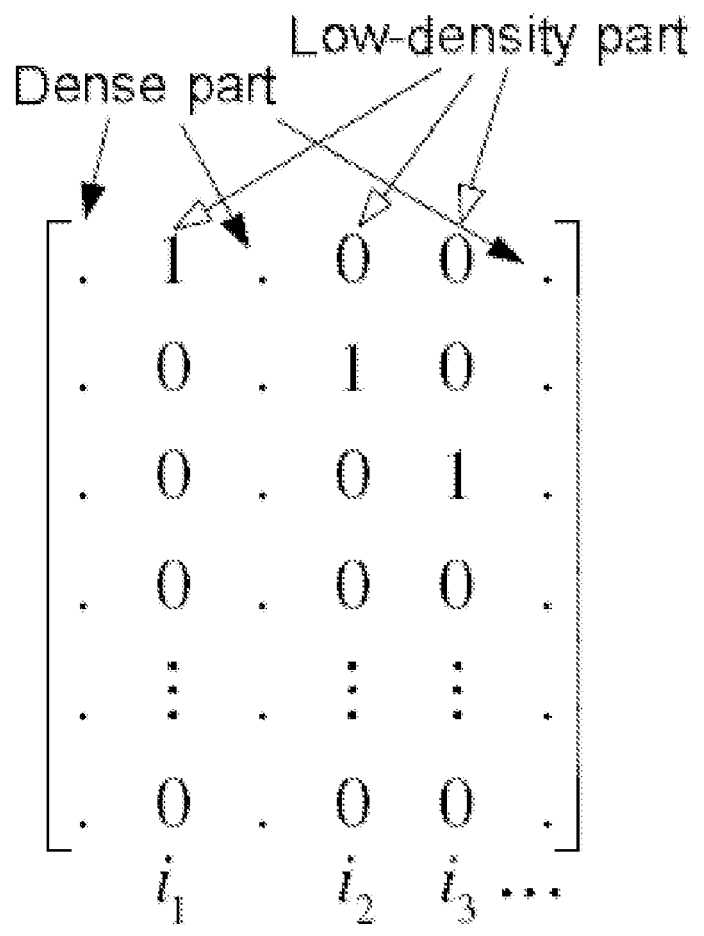

Let l denote the iteration step. At the initialization step (l=0), the decoding starts with the received channel LLRs and the binary parity check matrix, $H_b^{(0)}$=$H_b$. The decoding proceeds then as follows. In the adaptation step, the LLRs are sorted based on their absolute value in an ascending fashion and ordering indices are stored. Let $L_{i_j}^{(l)}$={$L_{i_1}^{(l)}, \ldots, L_{i_N}^{(l)}$} be the sorted list of LLRs and {$i_1, \ldots, i_N$} be the stored indices. The first LLR, $L_{i_1}^{(l)}$, corresponds to the least reliable bit—the $i_1$-th bit in the block—and the last LLR, $L_{i_N}^{(l)}$, corresponds to the most reliable bit—$i_N$-th bit in the block. After this phase, starting from j=$i_1$ to $i_N$, row operations are performed to systemize the j-th column of $H_b^{(l)}$ to form a unity weight column $e_j$=$[0..010..0]^T$, in which the only non-zero element is placed at the j-th position. If such systemization is not applicable the process is continued with the next column in $L^{(l)}$. The systemization is performed using, for example, the Gaussian elimination method. Since the binary parity check matrix is of full-rank, at least n−k columns are systemized to be of unity weight. FIG. 21 shows the form of an adapted parity check matrix which is decomposed into dense parts and low-density parts.

After the adaptation step, the SP process is applied on the sorted LLRs, $L^{(l)}$, based on the adapted parity check matrix, $H_b^{(l)}$, to generate the extrinsic LLRs, $L_{ext}^{(l)}$. The LLR $L^{(l+1)}$ is then updated according to $$L^{(l+1)} = L^{(l)} + \lambda \times L_{ext}^{(l)}, \quad (10)$$

where 0<$\lambda$<1 is a damping coefficient. The process returns to the adaptation step unless it has been executed for a fixed maximum number of iterations, $l_{max}$, or all the parity checks are satisfied. Optionally, an Incorporated Hard-Decision (IHD) step is performed at the end of each iteration by hard decisions on LLRs produced by the SP process. At the end of the decoding process, the most likely codeword is selected. This variance improves the convergence as well as the performance of the iterative RS decoder.

Since the SP process inherently operates on reliabilities it is easily incorporated into the adaptation and the update process. However, this situation is different for stochastic decoding methods. Stochastic decoding methods convert the channel reliabilities to stochastic bit streams and decoding proceeds entirely in bit-serial fashion. Therefore, to incorporate with the reliability update and the adaptation steps, the stochastic RS decoding method and decoder according to the invention is designed to provide soft-output information.

To provide soft-output information saturating up/down counters are used with each counter being assigned to one equality node. A counter is incremented if the corresponding equality node output bit is "1", unless the counter has reached its maximum limit (+U). Similarly, when the equality node output bit is "0" the counter is decremented, unless it has reached its minimum limit (−U). After a predetermined number of DCs, the contents of the counters is converted to soft information and the reliability update and the parity check matrix adaptation steps are performed.

Let V be the value of a saturating up/down counter associated with an equality node (−U≤V≤+U). This value is transformed to soft-information in the probability domain as $P_{ext}$=(V+U)/2U. Consequently, the corresponding extrinsic LLR of the equality node is determined as:

$$L_{ext} = \ln\left(\frac{P_{ext}}{1 - P_{ext}}\right) = \ln\left(\frac{U+V}{U-V}\right), \quad (11)$$

where ln( . . . ) indicates the natural logarithm operation.

Optionally, the contents of the saturating counters are used for the IHD method. In this case, a hard decision is applied to V, which is similar to the above usage of up/down counters where the sign-bit of the counter determines the hard-decision. Thus, a "0" sign-bit indicates a negative value or a −1 decision and, a "1" sign-bit indicates a positive value or a +1 decision.

As described above, the expansion of the parity check matrix of a RS code to its binary representation results in a dense matrix, $H_b$. Equivalently, the corresponding factor graph has equality and parity check nodes with degrees $d_e$ and $d_c$ substantially higher than the degrees of nodes in LDPC codes. For example, the equivalent factor graph for a (63, 55) RS code comprises 378 equality nodes and 48 parity check nodes over GF ($2^6$). The maximum degree of the equality nodes and the parity check nodes is 34 and 184, respectively, and approximately 77% of the equality nodes have a degree $d_e \geq 20$.

As the degree of the equality node increases, the likelihood of the equality node being in a hold state also increases, because it is less likely to have equal input bits with an increasing number of input ports. Therefore, a high-degree equality node is likely in a hold state. To overcome this problem, the high-degree equality nodes are partitioned into a plurality of degree-3 equality sub-nodes. A partitioned high-degree equality node is less likely to be in a hold state, because by having stochastic input bits which are either mostly "0"—or "1"—the likelihood for the degree-3 exit sub-node is substantially less. Therefore, the entire node is less likely to be in a hold state. Employment of EMs and/or IMs, as described above, in factor graphs of RS codes substantially improves convergence and, therefore, decoding performance.

Figure 22:
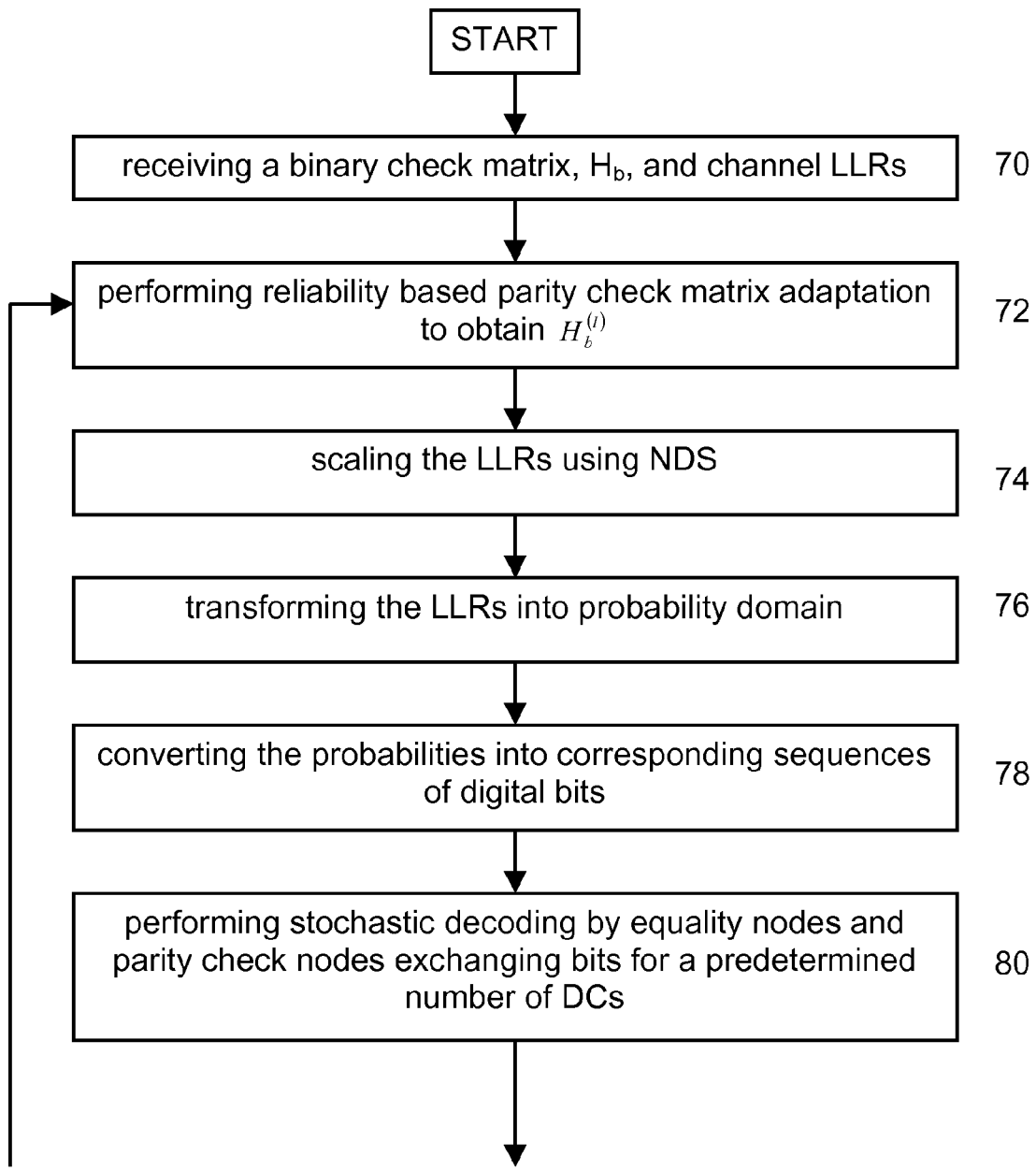
Figure 22:
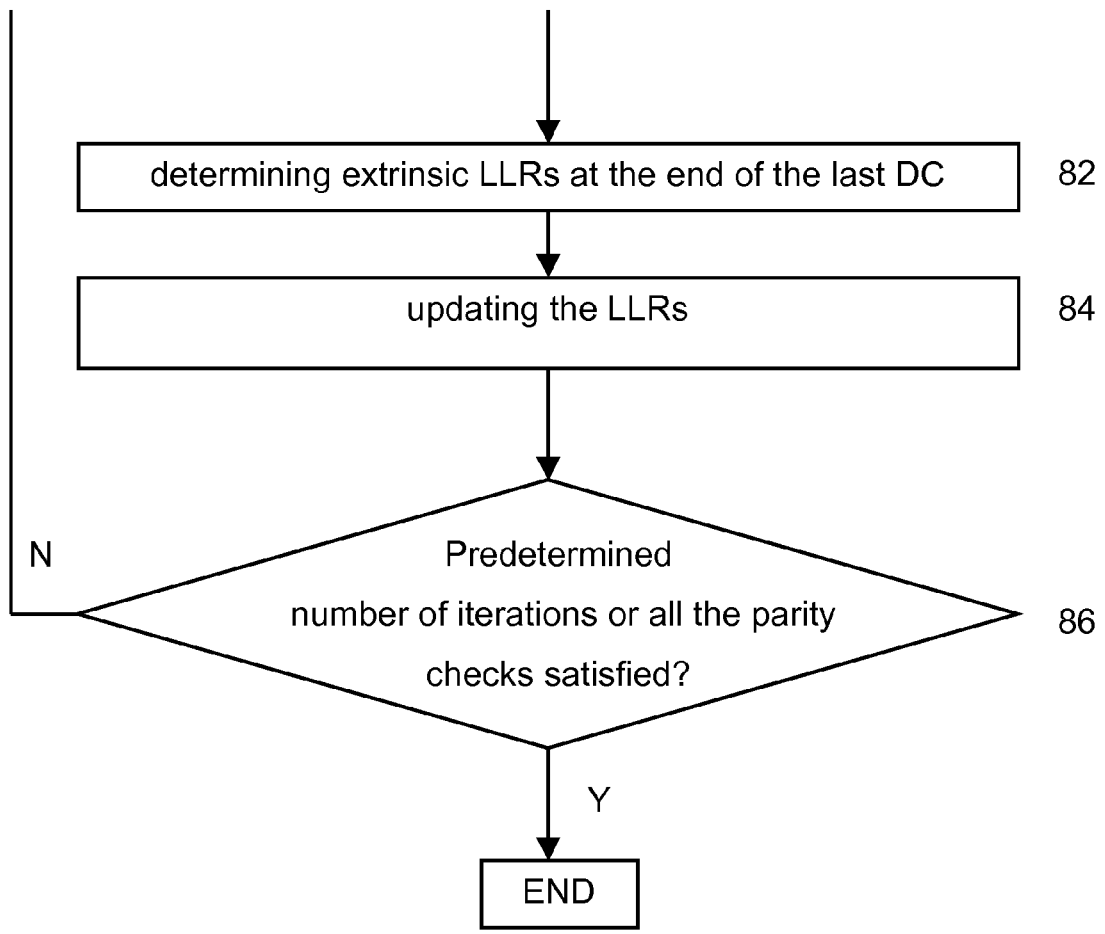

Referring to FIG. 22 a simplified flow diagram of a method for stochastic RS decoding according to an embodiment of the invention is shown. In an initialization step, a binary parity check matrix, $H_b$, and channel LLRs are received—70. At the adaptation step—72, the reliability based parity check matrix adaptation is performed to obtain $H_b^{(l)}$. After the adaptation step the LLRs are scaled using NDS according to equation (8)—74—and then transformed into the probability domain—76. The probabilities are then converted into corresponding sequences of digital bits—78. Stochastic decoding is then applied to the sequences of digital bits by equality nodes and parity check nodes exchanging bits for a predetermined number of DCs—80. At the end of the last DC, based on the contents of the up/down counters, the extrinsic LLRs, $L_{ext}^{(l)}$, are calculated according to equation (11)—82. $L_{ext}^{(l)}$ is then used to update the LLRs according to equation (10)-84. In addition to the soft-output information IHD is optionally applied to the contents of the up/down counters. The decoding process then returns to the adaptation step 72 unless the decoding process has been executed for a predetermined number of iterations, $l_{max}$, or all the parity checks are satisfied—86.

The method for stochastic RS decoding according to the invention is performed using one of the stochastic decoders disclosed above with respect to the LDPC decoding. It is noted that due to the high-density of the binary parity check matrix $H_b$, the correlation between stochastic messages within the factor graph are substantially higher than the correlation within the factor graph of a LDPC code of similar length. Therefore, in stochastic RS decoding EMs capable of storing a larger number of output bits are employed to alleviate latching. Of course, IMs and counter circuitries are optionally employed.

Numerous other embodiments of the invention will be apparent to persons skilled in the art without departing from the spirit and scope of the invention as defined in the appended claims.

What is claimed is:

1. A logic circuitry comprising:
   logic components forming equality nodes and parity check nodes, the equality nodes and the parity check nodes perform an equality function and a parity check function in a stochastic decoding process, respectively;
      the equality nodes and the parity check nodes being electrically coupled such that they represent a factor graph of a parity check matrix of a linear code; and
   the logic circuitry comprising a plurality of counter circuitries, each counter circuitry comprising a counter electrically coupled to a respective equality node, each counter circuitry provides a chosen symbol in dependence upon the respective equality node being in a hold state.

2. The logic circuitry as defined in claim 1 wherein the equality nodes and the parity check nodes are electrically coupled such that they represent a factor graph of the parity check matrix of a low density parity check code.

3. The logic circuitry as defined in claim 1 wherein the counter of each counter circuitry:
   receives an output symbol from the respective equality node when the respective equality node is in a regular state and performs one of incrementing and decrementing its content in dependence upon the received output symbol; and,
   provides its content when the respective equality node is in a hold state;
   wherein the logic circuitry comprises a comparator electrically coupled to the counter and to a source of one of a random and pseudo-random number, the comparator for receiving the content of the counter, for comparing the content of the counter with one of a received random and pseudo-random sequence of digital bits to produce a comparison result, and for providing the chosen symbol in dependence upon the comparison result.

4. The counter circuitry as defined in claim 3 wherein the counter is an up/down counter.

5. The counter circuitry as defined in claim 4 comprising:
   one of a negative and a positive feedback line in communication with an output port of one of the counter and the comparator, the one of a negative and a positive feedback line for providing feedback to the counter.

6. The counter circuitry as defined in claim 5 comprising:
   a switching mechanism disposed in the one of a negative and a positive feedback line, the switching mechanism for selectively operating the counter with feedback and absent feedback.

7. The counter circuitry as defined in claim 4 comprising:
   a negative and a positive feedback line in communication with an output port of the counter and the comparator, respectively, the negative and the positive feedback line for providing feedback to the counter.

8. The counter circuitry as defined in claim 7 comprising:
   a switching mechanism disposed in the negative and the positive feedback line, the switching mechanism for selectively operating the counter in any one of:
   a) with negative and positive feedback;
   b) with only negative feedback;

c) with only positive feedback; and, d) absent feedback.

9. The counter circuitry as defined in claim 4 wherein the counter comprises an up counter and a down counter.

10. The counter circuitry as defined in claim 9 wherein each of the up counter and the down counter comprises one of a negative feedback line and a positive feedback line.

11. The counter circuitry as defined in claim 9 wherein each of the up counter and the down counter comprises a negative feedback line and a positive feedback line.

12. A method performed using a counter circuitry for each of a plurality of equality nodes of a logic circuitry for stochastic decoding, the counter circuitry comprising a counter, the method performed in each counter circuitry comprising:

receiving an output symbol from the respective equality node when the respective equality node is in a regular state;

one of incrementing and decrementing content of the counter in dependence upon the received output symbol; and, providing an output symbol in dependence upon the content when the respective equality node is in a hold state.

13. The method as defined in claim 12 comprising comparing the content with one of a received random and pseudo-random sequence of digital bits to produce a comparison result and providing the output symbol in dependence upon the comparison result.

14. The method as defined in claim 13 wherein for incrementing a first step size is used for decrementing a second different step size is used.

15. The method as defined in claim 13 wherein for the counter circuitry for each of a first subset of the plurality of equality nodes a first step size is used for one of incrementing and decrementing and wherein for the counter circuitry for each of a second subset of the plurality of equality nodes a second different step size is used for one of incrementing and decrementing.

16. The method as defined in claim 13 wherein a step size for one of incrementing and decrementing is adjusted during the stochastic decoding process.

17. A logic circuitry comprising:

logic components forming equality nodes and parity check nodes, the equality nodes and the parity check nodes perform an equality function and a parity check function in a stochastic decoding process, respectively;

the equality nodes and the parity check nodes being electrically coupled such that they represent a factor graph of a parity check matrix of a linear code; and each equality node of at least a subset of the equality nodes comprises:

a plurality of sub nodes forming the equality node; and, internal memory interposed between the sub nodes such that the internal memory is connected to an output port of a respective sub node and to an input port of a following sub node, the internal memory for providing a chosen symbol if a respective sub node is in a hold state.

18. The logic circuitry as defined in claim 17 wherein the equality nodes and the parity check nodes are electrically coupled such that they represent a factor graph of the parity check matrix of a linear block code.

19. The logic circuitry as defined in claim 17 wherein each internal memory is electrically coupled to a source of one of a random and pseudo-random sequence of digital bits for choosing a stored symbol.

20. The logic circuitry as defined in claim 17 wherein the internal memory comprises one of a lookup-table, a register, a shift register, a linear feedback shift register, and a counter.

* * * * *